US 10,751,993 B2

United States Patent
Kida et al.

(12) United States Patent
Kida et al.

(10) Patent No.: US 10,751,993 B2
(45) Date of Patent: Aug. 25, 2020

(54) LIQUID DISCHARGE HEAD, LIQUID DISCHARGE DEVICE, AND LIQUID DISCHARGE APPARATUS

(71) Applicants: Hitoshi Kida, Kanagawa (JP); Hiroya Tokita, Kanagawa (JP)

(72) Inventors: Hitoshi Kida, Kanagawa (JP); Hiroya Tokita, Kanagawa (JP)

(73) Assignee: Ricoh Company, Ltd., Tokyo (JP)

( * ) Notice: Subject to any disclaimer, the term of this patent is extended or adjusted under 35 U.S.C. 154(b) by 0 days.

(21) Appl. No.: 16/351,231

(22) Filed: Mar. 12, 2019

(65) Prior Publication Data

US 2019/0202204 A1    Jul. 4, 2019

Related U.S. Application Data

(63) Continuation of application No. 15/799,325, filed on Oct. 31, 2017, now Pat. No. 10,272,678.

(30) Foreign Application Priority Data

Nov. 18, 2016 (JP) .................................. 2016-225503
Sep. 15, 2017 (JP) .................................. 2017-177626

(51) Int. Cl.
  *B41J 2/14*   (2006.01)
  *B41J 2/485*  (2006.01)
  *B41J 2/145*  (2006.01)
  *H05K 1/02*   (2006.01)
  (Continued)

(52) U.S. Cl.
  CPC .................. *B41J 2/14* (2013.01); *B41J 2/145* (2013.01); *B41J 2/14233* (2013.01); *B41J 2/485* (2013.01); *H05K 1/00* (2013.01); *H05K 1/028* (2013.01); *H05K 1/147* (2013.01); *B41J 2002/14241* (2013.01); *B41J 2002/14419* (2013.01);
  (Continued)

(58) Field of Classification Search
  None
  See application file for complete search history.

(56) References Cited

U.S. PATENT DOCUMENTS 7,819,502 B2    10/2010  Enomoto
2005/0174469 A1*  8/2005  Cho .................. H01L 27/14618
                                                              348/340

(Continued)

FOREIGN PATENT DOCUMENTS

JP    2004-090481    3/2004
JP    2005-219229    8/2005

(Continued)

*Primary Examiner* — Erica S Lin
*Assistant Examiner* — Tracey M McMillion
(74) *Attorney, Agent, or Firm* — Oblon, McClleland, Maier & Neustadt, L.L.P.

(57) ABSTRACT

A liquid discharge head includes a body to discharge liquid, a first wiring substrate extending from the body, and a second wiring substrate electrically connected to the first wiring substrate. The body includes a nozzle face in which a plurality of nozzles, from which the liquid is discharged, is formed. The second wiring substrate is disposed along a direction perpendicular to the nozzle face of the body, a principal surface of the first wiring substrate is disposed along a short side of the body, and a principal surface of the second wiring substrate is disposed along a longitudinal direction of the body.

18 Claims, 21 Drawing Sheets

(51) Int. Cl.
*H05K 1/14* (2006.01)
*H05K 1/00* (2006.01)
(52) U.S. Cl.
CPC ............... *B41J 2002/14491* (2013.01); *H05K 2201/055* (2013.01)

(56) References Cited

U.S. PATENT DOCUMENTS

| | | |
|---|---|---|
| 2010/0171794 A1* | 7/2010 | Miyata ................. B41J 2/14233 347/50 |
| 2012/0069095 A1 | 3/2012 | Kida et al. |
| 2012/0212547 A1 | 8/2012 | Takemoto et al. |
| 2012/0229542 A1 | 9/2012 | Kida |
| 2014/0022305 A1 | 1/2014 | Kida |
| 2015/0029270 A1 | 1/2015 | Takemoto et al. |
| 2015/0070421 A1 | 3/2015 | Kida |
| 2015/0219688 A1* | 8/2015 | Jeon ....................... G01R 31/27 702/117 |
| 2016/0031212 A1 | 2/2016 | Kida |
| 2016/0152025 A1 | 6/2016 | Kida |

FOREIGN PATENT DOCUMENTS

| | | |
|---|---|---|
| JP | 2010-260201 | 11/2010 |
| JP | 2011-161694 | 8/2011 |
| JP | 2013-059907 | 4/2013 |
| JP | 2013-169742 | 9/2013 |
| JP | 2014-019110 | 2/2014 |
| JP | 2015-178264 | 10/2015 |
| JP | 2015-189184 | 11/2015 |

\* cited by examiner

LIQUID DISCHARGE HEAD, LIQUID DISCHARGE DEVICE, AND LIQUID DISCHARGE APPARATUS

CROSS-REFERENCE TO RELATED APPLICATIONS

This is a continuation of U.S. patent application Ser. No. 15/799,325 filed Oct. 31, 2017, which is based on and claims priority pursuant to 35 U.S.C. § 119(a) to Japanese Patent Application No. 2016-225503 filed Nov. 18, 2016, in the Japan Patent Office and Japanese Patent Application No. 2017-177626 filed Sep. 15, 2017, in the Japan Patent Office, the entire contents of each of which are incorporated herein by reference.

BACKGROUND

Technical Field

Aspects of this disclosure relate to a liquid discharge head, a liquid discharge device, and a liquid discharge apparatus.

Related Art

A liquid discharge head includes a wiring substrate to supply drive signals to a pressure generator and a connector to connect the wiring substrate to a wiring substrate disposed outside the liquid discharge head.

A flexible substrate is pulled out from a body of the liquid discharge head so that a principal surface of the flexible substrate is along a longitudinal direction of the body. The flexible substrate is connected to a circuit substrate while facing the circuit substrate. A principal surface of the circuit substrate is arranged along the longitudinal direction of the body A flexible substrate may be pulled out from one end of the body in a longitudinal direction of the body so that a principal surface of the flexible substrate is along a short side of the body.

SUMMARY

In an aspect of this disclosure, a novel liquid discharge head includes a body to discharge liquid, a first wiring substrate extending from the body, and a second wiring substrate electrically connected to the first wiring substrate. The body includes a nozzle face in which a plurality of nozzles, from which the liquid is discharged, is formed. The second wiring substrate is disposed along a direction perpendicular to the nozzle face of the body, a principal surface of the first wiring substrate is disposed along a short side of the body, and a principal surface of the second wiring substrate is disposed along a longitudinal direction of the body.

In another aspect of this disclosure, a liquid discharge device includes the liquid discharge head.

In still another aspect of this disclosure, a liquid discharge apparatus includes the liquid discharge device.

BRIEF DESCRIPTION OF THE SEVERAL VIEWS OF THE DRAWINGS

The aforementioned and other aspects, features, and advantages of the present disclosure will be better understood by reference to the following detailed description when considered in connection with the accompanying drawings, wherein.

Figure 1:
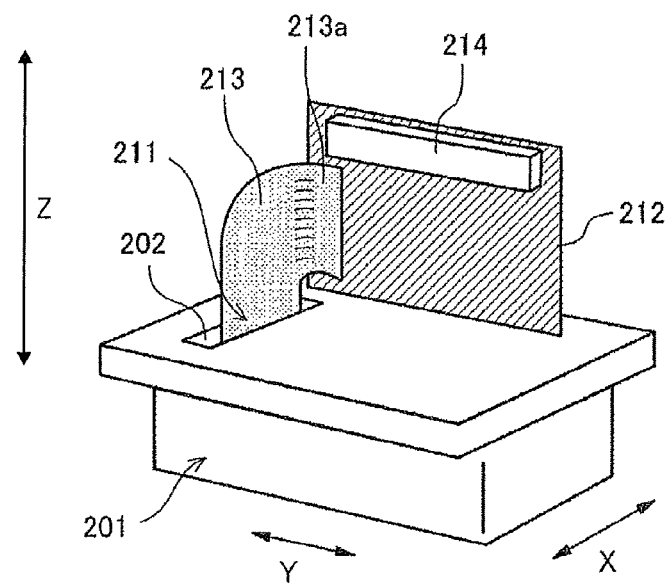
FIG. 1 is a perspective view of a liquid discharge head according to a first embodiment of the present disclosure.

The accompanying drawings are intended to depict embodiments of the present disclosure and should not be interpreted to limit the scope thereof. The accompanying drawings are not to be considered as drawn to scale unless explicitly noted.

DETAILED DESCRIPTION

In describing embodiments illustrated in the drawings, specific terminology is employed for the sake of clarity. However, the disclosure of this patent specification is not intended to be limited to the specific terminology so selected and it is to be understood that each specific element includes all technical equivalents that have the same function, operate in a similar manner, and achieve similar results.

Although the embodiments are described with technical limitations with reference to the attached drawings, such description is not intended to limit the scope of the disclosure and all of the components or elements described in the embodiments of this disclosure are not necessarily indispensable. As used herein, the singular forms "a", "an", and "the" are intended to include the plural forms as well, unless the context clearly indicates otherwise.

Referring now to the drawings, wherein like reference numerals designate identical or corresponding parts throughout the several views, embodiments of the present disclosure are described below.

Figure 2:
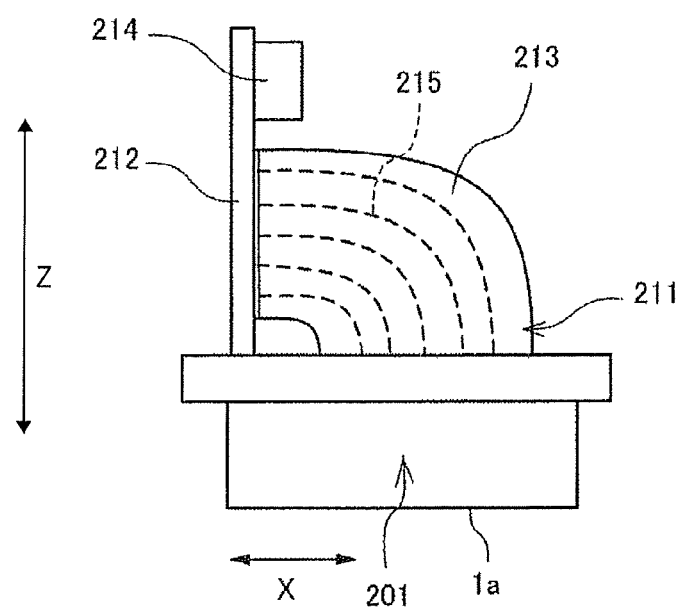
FIG. 2 is a side view seen from a short side of the liquid discharge head.
Figure 3:
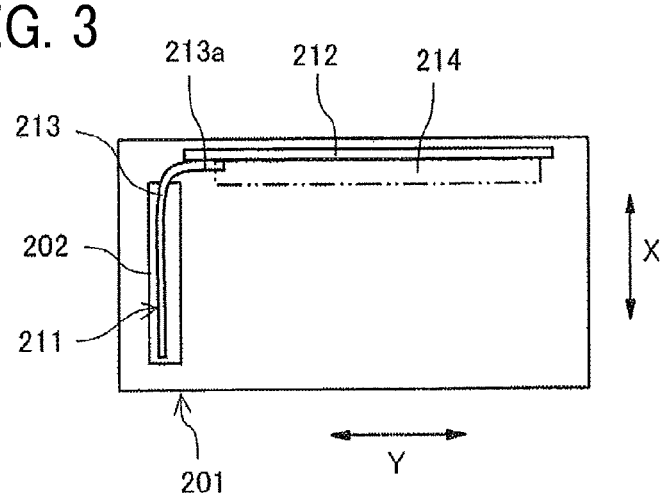
FIG. 3 is a plan view of the liquid discharge head.

FIGS. 1 to 3 illustrate a head 404 according to a first embodiment of the present disclosure. Hereinafter, the head 404 is simply referred to as "head 404".

FIG. 1 is a perspective view of the head 404 according to an embodiment of the present disclosure.

FIG. 2 is a side view seen from a short side of the head 404.

FIG. 3 is a plan view of the head 404.

The liquid discharge head 404 includes a body 201, a first wiring substrate 211, and a second wiring substrate 212. The body 201 discharges liquid from nozzles 4 formed on a nozzle face 1a of the head 404. The first wiring substrate 211 extends from the slit (opening) 202 and communicates with an interior of the body 201. The second wiring substrate 212 is arranged along a direction perpendicular to a surface of the nozzle face 1a of the body 201 (indicated by arrow "Z" in FIGS. 1 and 2). The second wiring substrate 212 is electrically connected to the first wiring substrate 211. Hereinafter, "the liquid discharge head" is simply referred to as "head".

In the present embodiment, a flexible wiring board (FPC) is used for the first wiring substrate 211 and a printed circuit board (PCB) is used for the second wiring substrate 212.

A principle surface of the first wiring substrate 211 is arranged along the short side (indicated by an arrow "X" in FIGS. 1 and 2) of the body 201. The first wiring substrate 211 is extending from a slit 202 formed at one end portion in a longitudinal direction (indicated by an arrow "Y" in FIG. 1) of the body 201. The first wiring substrate 211 is connected to a wiring pattern of a pressure generator and a driver integrated circuit (driver IC) in the body 201.

A principle surface of the second wiring substrate 212 is disposed along a longitudinal direction of the body 201. A connector 214 is mounted on the second wiring substrate 212 such that a terminal array of the connector 214 is disposed in a direction along the longitudinal direction of the body 201. The connector 214 is connectable with a connector. This connector is provided on a wiring member that is connected to a host apparatus and transmits a signal such as a control signal or a drive signal.

The first wiring substrate 211 includes a bend 213 in which an extension direction of a wiring pattern 215 is changed from the direction perpendicular to the surface of the nozzle face 1a (extending direction) to the direction along the short side (indicated by an arrow "X" in FIGS. 1 and 2) of the body 201. A leading end 213a of the bend 213 is bent toward a direction along the longitudinal direction of the body 201 and is connected to the second wiring substrate 212 while facing the second wiring substrate 212.

The first wiring substrate 211 thus shaped is formed by bending a pulled out side (extending side) of the first wiring substrate 211 into substantially an L-shaped member. The wiring pattern 215 may extend obliquely from the slit 202 toward a connecting portion of the second wiring substrate 212 at the bend 213. The connecting portion is formed on a surface of the second wiring substrate 212 facing the first wiring substrate 211.

To connect the bend 213 of the first wiring substrate 211 and the second wiring substrate 212, a connector, an anisotropic conductive film (ACF), non-conductive paste (NCP), a solder connection, metal diffusion bonding, or wire bonding may be applied.

In this way, the first wiring substrate 211 connected inside the body 201 is extending from an end of the body in the longitudinal direction of the body 201. Thereby, the present embodiment can reduce a size of the body 201 in a direction perpendicular to the nozzle array of the head 404 (short side indicated by arrow X) even when signals corresponding to a plurality of nozzle arrays and power supply are supplied to the body 201. Thus, the head 404 can be miniaturized.

As described in FIG. 4 below, a plurality of rows (two rows in FIG. 4) of actuators including piezoelectric elements 11 is provided on an actuator substrate 20 in the body 201. A control-signal wiring pattern of a driver integrated circuit (IC) 500 to which a wiring pattern drawn from each row of actuators is connected and a drive source wiring pattern of the actuators are aggregated at an end part of the actuator substrate 20 in the nozzle array. In a part where the wiring patterns are aggregated, the first wiring substrate 211 is connected to each wiring pattern. Thereby, one first wiring substrate 211 can supply signals and drive source to the plurality rows of the actuators. Thus, it becomes easier to draw the first wiring substrate 211 from the body 201 and expertize a miniaturization of the head 404 in a width direction of the head 404.

A principal surface of the second wiring substrate 212 is disposed along a longitudinal direction of the body 201. The second wiring substrate 212 connects the body 201 to outside the body 201. The present embodiment thus can widen a width of the second wiring substrate 212 to a width of the body 201 in the longitudinal direction. Thus, the second wiring substrate 212 can mount a connector with a large number of pins.

Therefore, it is possible to avoid enlarging the body 201 and widen a wiring substrate to be connected to outside.

An example of the body 201 is described with reference to FIG. 4.

Figure 4:
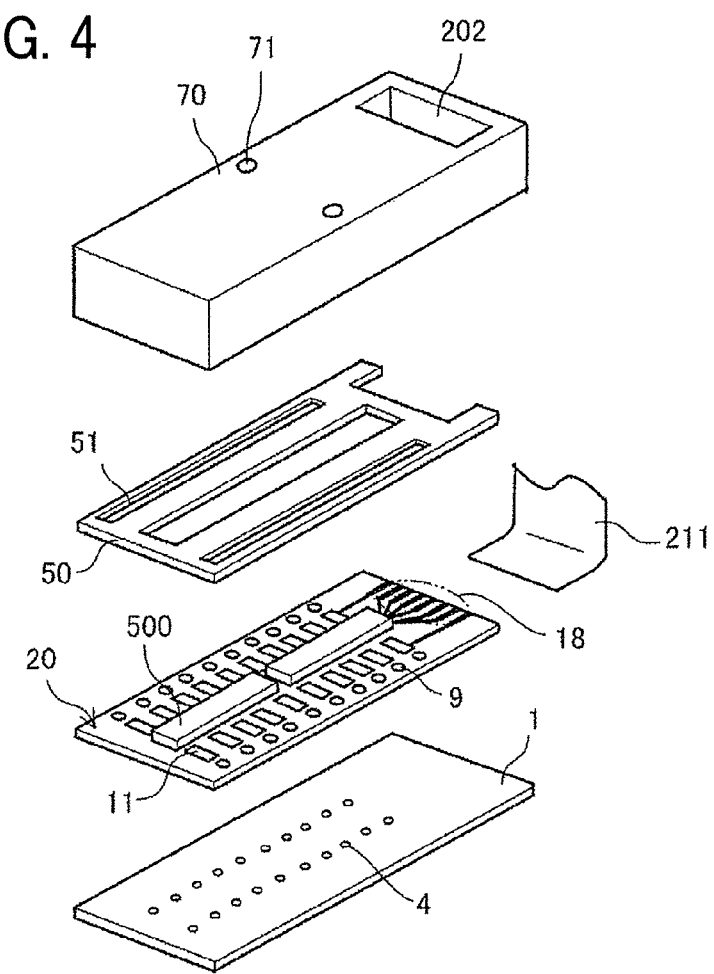
FIG. 4 is an exploded perspective view of the body.

FIG. 4 is an exploded perspective view of the body 201.

As illustrated in FIG. 4, the body 201 includes a nozzle plate 1, an actuator substrate 20, a holding substrate 50, and a common-chamber substrate 70.

Two rows of nozzle arrays are formed on the nozzle plate 1. Each nozzle arrays includes a plurality of nozzles 4 arrayed in the longitudinal direction Y (nozzle array) of the body 201.

The actuator substrate 20 includes an individual channel and piezoelectric elements 11 as a pressure generating element. The holding substrate 50 is connected to the actuator substrate 20. The common-chamber substrate 70 forms a common liquid chamber 10. The common-chamber substrate 70 also serves as a frame member of the body 201.

The holding substrate 50 includes openings 51 serves as a part of a common liquid chamber 10. The actuator substrate 20 includes openings 9 communicating the openings 51 of the holding substrate 50 with the individual liquid chambers 6 in the body 201. The common-chamber substrate 70 includes a liquid supply port 71 for supplying the liquid to the opening 51 of the holding substrate 50 from outside the body 201.

The driver IC 500 to drive the piezoelectric element 11 is mounted on the actuator substrate 20. The actuator substrate 20 includes a connection wiring pattern 18 on an end of the actuator substrate 20 in a longitudinal direction of the actuator substrate 20. The connection wiring pattern 18 is connected to the driver IC 500. Then, the first wiring substrate 211 is connected to this connection wiring pattern 18. The connection wiring pattern 18 and the wiring pattern 215 of the first wiring substrate 211 may be connected with wiring bonding.

A slit 202 is provided at an end in a longitudinal direction of the common-chamber substrate 70 of the body 201. The first wiring substrate 211 connected to the actuator substrate 20 is pulled out (extends) through the slit 202.

Figure 5:
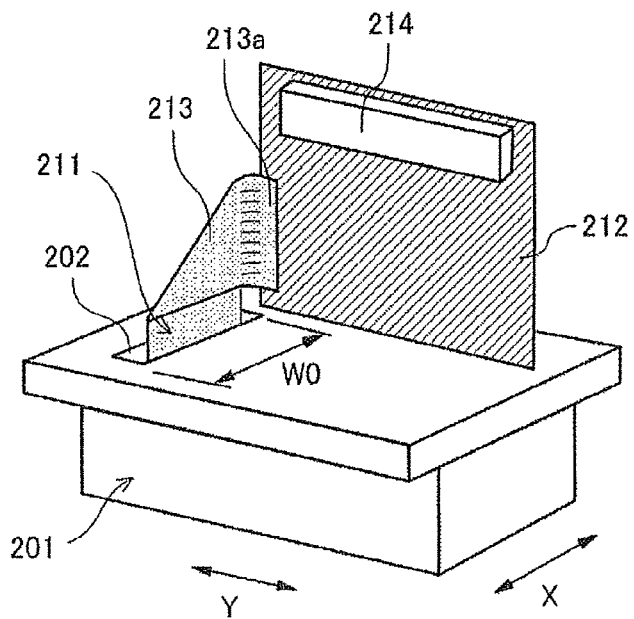
FIG. 5 is a perspective view of a liquid discharge head according to a second embodiment of the present disclosure.
Figure 6:
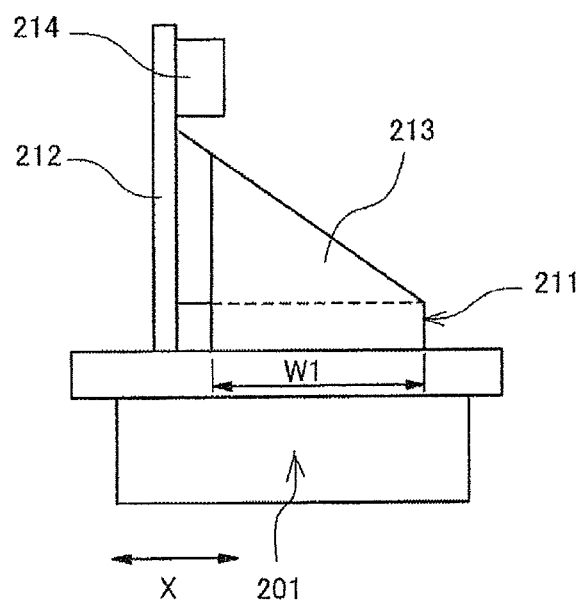
FIG. 6 is a side view seen from a short side of the liquid discharge head.

FIGS. 5 and 6 illustrate the head 404 according to a second embodiment of the present disclosure.

FIG. 5 is a perspective view of the head 404 according to the present embodiment. FIG. 6 is a side view seen from a short side (X direction) of the head 404.

The first wiring substrate 211 includes a bend 213 in which an extension direction of a wiring pattern 215 is changed from the direction perpendicular to the surface of the nozzle face 1a to the direction along the short side (indicated by an arrow "X" in FIGS. 5 and 6) of the body 201. A portion of the first wiring substrate 211 extending from the slit 202 of the body 201 is bended along a short side (X direction) of the body 201. This bended portion of the first wiring substrate 211 forms the bend 213. The leading end 213a of the bend 213 is bent toward a direction along the longitudinal direction of the body 201 and is connected to the second wiring substrate 212 while facing the second wiring substrate 212.

In this case, a shape of the first wiring substrate 211 is linear before the first wiring substrate 211 is bent. A maximum width W1 of the first wiring substrate 211 is smaller than a width W0 of the slit 202 in a direction along a short side (X direction) of the body 201. Here, in the previously-described first embodiment, the width W1 of the first wiring substrate 211 is larger than the width W0 of the slit 202 because a maximum width of the first wiring substrate 211 includes the bend 213.

Accordingly, the first wiring substrate 211 can be pulled out (extend) through the slit 202 from an inner side of the body 201.

That is, in the previously-described body 201 in FIG. 4, the first wiring substrate 211 can be extending from an interior the slit 202 to the outside the slit 202 of the common-chamber substrate 70. Thus, it becomes possible to join the holding substrate 50 to be joined to the actuator substrate 20 and the common-chamber substrate 70 after passing the first wiring substrate 211 connected to the actuator substrate 20 through the slit 202 of the common-chamber substrate 70.

Thereby, the present embodiment does not have to connect the first wiring substrate 211 to the actuator substrate 20 after passing the first wiring substrate 211 through the slit 202 from outside the common-chamber substrate 70. Thus, a large sized common-chamber substrate 70 served as a frame does not interfere a connection operation of the actuator substrate 20 and the first wiring substrate 211. Thus, the present embodiment improves assembly.

Figure 7:
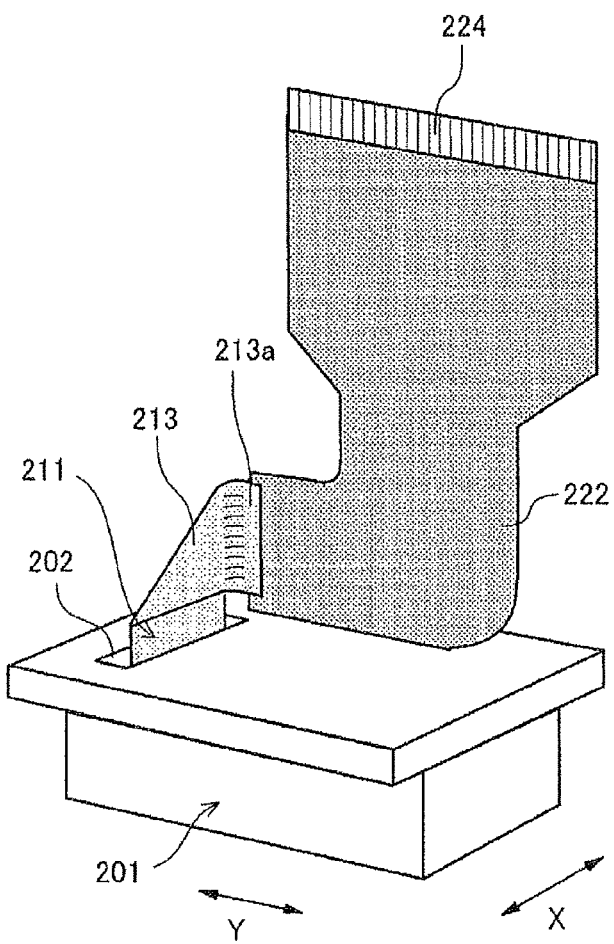
FIG. 7 is a perspective view of a liquid discharge head according to a third embodiment of the present disclosure.

FIG. 7 illustrates the head 404 according to a third embodiment of the present disclosure, showing a perspective view of the head 404 according to the present embodiment.

In the present embodiment, a flexible printed circuit (FPC) is used for the second wiring substrate 222. The second wiring substrate 222 includes a terminal 224 and is connected to a connector of the host device to receive control signals and power.

Figure 8:
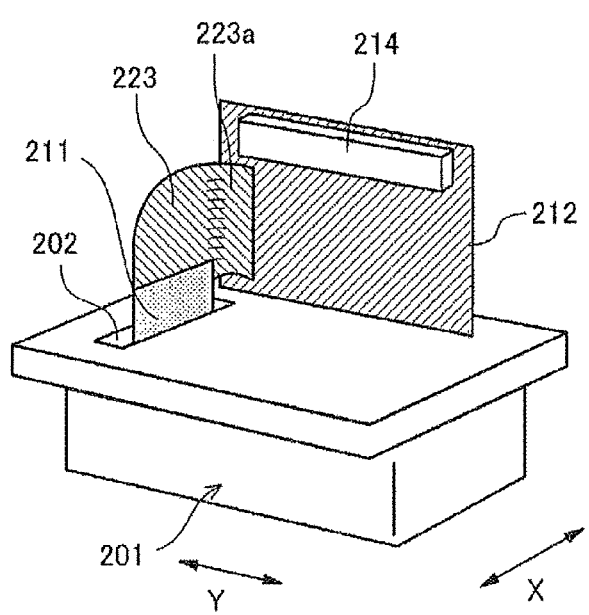
FIG. 8 is a perspective view of a liquid discharge head according to a fourth embodiment of the present disclosure.

FIG. 8 illustrates the head 404 according to a fourth embodiment of the present disclosure, showing a perspective view of the head 404 according to the present embodiment.

In the present embodiment, the first wiring substrate 211 and the second wiring substrate 212 are connected by a third wiring substrate 223 that is different with the first wiring substrate 211 and the second wiring substrate 212. The third wiring substrate 223 includes a wiring pattern similar to the bend 213 of the first wiring substrate 211 in the first embodiment. A leading end 223a of the third wiring substrate 223 is bent toward the longitudinal direction of the body 201 and is connected to the second wiring substrate 212 while facing the second wiring substrate 212.

Therefore, the first wiring substrate 211 can be connected to the second wiring substrate 212 without bending the first wiring substrate 211 as described in the second embodiment while the width of the first wiring substrate 211 is a constant value smaller than the width of the slit 202.

In this case, the third wiring substrate 223 and the second wiring substrate 212 are separately manufactured and joined by, for example, a connector, an anisotropic conductive film (ACF), non-conductive paste (NCP), a solder connection, metal diffusion bonding, or wire bonding.

The third wiring substrate 223 and the second wiring substrate 212 may be formed by a rigid flexible substrate (rigid flex substrate) of a flying lead type. The rigid flex substrate is made by integrating a rigid substrate and a flexible substrate. This configuration can improve connection reliability and reduce connection processes.

The fourth embodiment can shorten a length of the first wiring substrate 211 connected to the body 201 to be shorter than the length of the first wiring substrate 211 in the first embodiment. Thus, handling of the first wiring substrate 211 improves. Further, a connection process of the first wiring substrate 211 and the actuator substrate 20 or an assembly workability of the body 201 improves. Further, shortening the length of the first wiring substrate 211 makes the first wiring substrate 211 easier to pass through the slit 202. Thus, workability is improved also in this respect.

Figure 9:
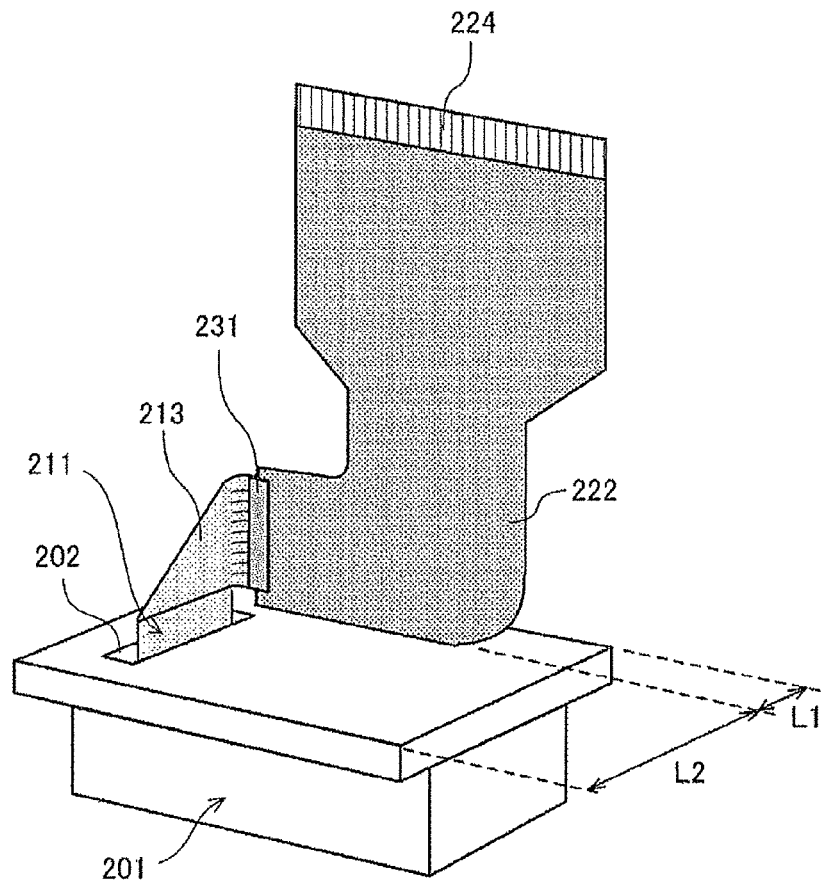
FIG. 9 is a perspective view of a liquid discharge head according to a fifth embodiment of the present disclosure.
Figure 10:
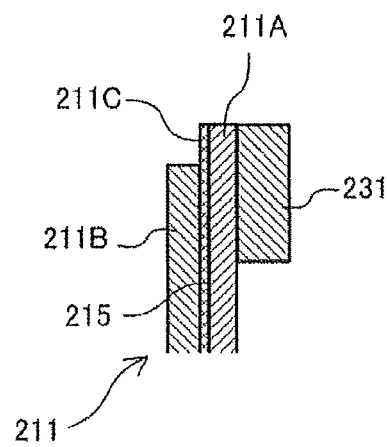
FIG. 10 is a cross-sectional view of a leading portion of a first wiring substrate.

FIGS. 9 and 10 illustrate the head 404 according to a fifth embodiment of the present disclosure.

FIG. 9 is a perspective view of the head 404 according to the present embodiment. FIG. 10 is a cross-sectional view of a leading portion of the first wiring substrate 211.

In the present embodiment, the first wiring substrate 211 includes a base 211A, a wiring pattern 215, and a protection layer 211B. The wiring pattern 215 is provided on the base 211A and is covered by the protection layer 211B. A reinforcing plate 231 is provided on an end of the first wiring substrate 211 to be connected to the second wiring substrate 212.

The reinforcing plate 231 is for reinforcing a terminal portion of the first wiring substrate 211. A reinforcing film is used for the reinforcing plate 231, for example. This reinforcing plate 231 is provided on a surface of the base 211A opposite to a surface on which a terminal 211C of the base 211A is provided. The terminal 211C is an exposed portion of the wiring pattern 215 not covered by the protection layer 211B. A thickness of the reinforcing plate 231 is greater than a thickness of the protection layer 211B.

The fifth embodiment is otherwise configured the same as the third embodiment.

The first wiring substrate 211 is connected to the second wiring substrate 222 or the third wiring substrate 223 (other wiring substrate) on a surface opposite to a surface on which the reinforcing plate 231 is provided. A first distance L1 is from a surface of the first wiring substrate 211 on which the first wiring substrate 211 is joined to the second wiring substrate 222 to one end of an outer circumference of the body 201 in the direction along the short side (X direction) of the body 201. A second distance L2 is from the surface on which the reinforcing plate 231 is provided to another end of the outer circumference of the body 201 in the direction along the short side (X direction) of the body 201. The first distance L1 is shorter than the second distance L2.

Thereby, a joining tool such as a heater chip can be contact to a joining portion from one of a closer distance side (first distance L1 side) from the outer circumference of the body 201 to the joining portion of the first wiring substrate 211 and the second wiring substrate 212.

Thus, the body 201 and the joining tool do not interface with each other. Even the joining portion is closed to the body 201 (even a protruding amount of the first wiring substrate 211 from the body 201 is small), the first wiring substrate 211 can be joined to the second wiring substrate 212. Thus, the fifth embodiment can reduce the size of the head 404.

Figure 11:
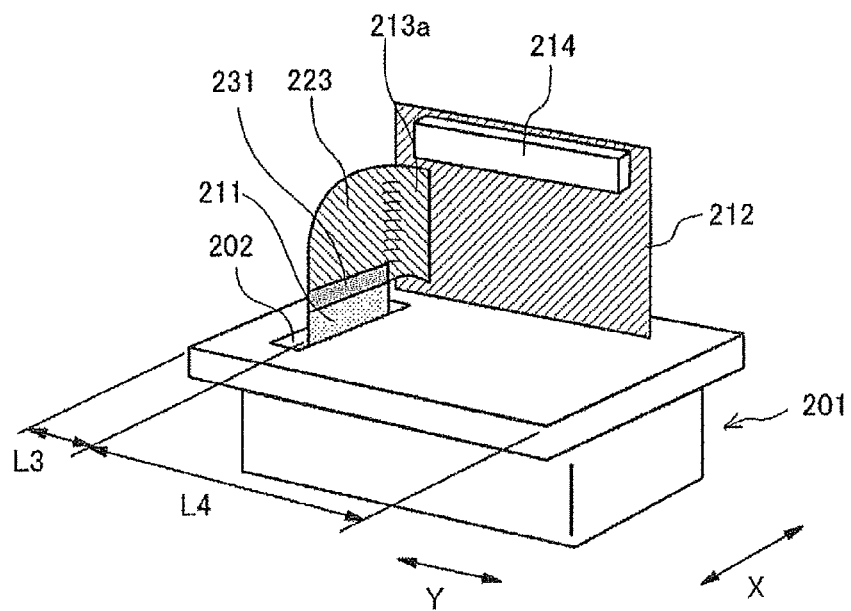
FIG. 11 is a perspective view of a liquid discharge head according to a sixth embodiment of the present disclosure.

FIG. 11 illustrates the head 404 according to a sixth embodiment of the present disclosure, showing a perspective view of the head 404 according to the present embodiment.

In the present embodiment, a reinforcing plate 231 is provided on an end of the first wiring substrate 211 to be connected to the third wiring substrate 223 as shown in the fourth embodiment in FIG. 8.

The first wiring substrate 211 is connected to the third wiring substrate 223 that is another wiring substrate on a surface opposite to a surface on which the reinforcing plate 231 is provided. A third distance L3 is from a joining surface of the first wiring substrate 211 and the third wiring substrate 223 to one end of the outer circumference of the body 201 in the longitudinal direction of the body 201. A fourth distance L4 is from the surface on which the reinforcing plate 231 is provided to another end of the outer circumference of the body 201. The third distance L3 is shorter than the fourth distance L4.

According to such a configuration, it is possible to obtain the same functional effect as that of the fifth embodiment.

Figure 12:
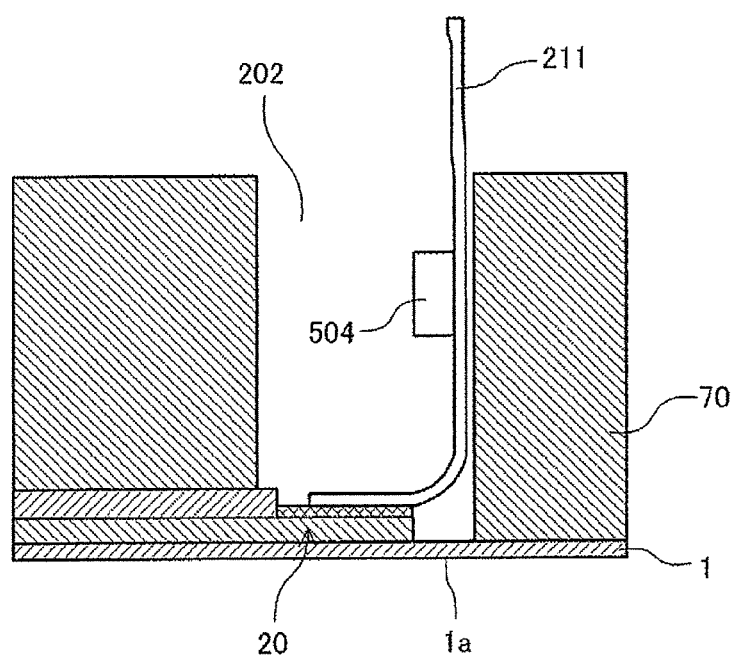
FIG. 12 is a cross-sectional view of a main portion of a liquid discharge head according to a seventh embodiment of the present disclosure.

FIG. 12 illustrates the head 404 according to a seventh embodiment of the present disclosure, showing a cross-sectional view of a main portion of the head 404 according to the present embodiment.

The first wiring substrate 211, one end of which is connected to the actuator substrate 20, is bent from the direction along the nozzle face 1a toward a direction perpendicular to the nozzle face 1a and is pulled out (extends) through the slit 202 of the common-chamber substrate 70.

Here, an electrical part 504 such as a capacitor is mounted on a side that becomes an inner face of the first wiring substrate 211 in a state in which the first wiring substrate 211 is bent. This inner face is not an interior surface of the head 404 but an inner surface of an arc of the first wiring substrate 211 formed by bending the first wiring substrate 211.

When the first wiring substrate 211 is bent 90 degree in a state in which the first wiring substrate 211 is connected to the actuator substrate 20, the first wiring substrate 211 tries to restore to a condition in which the first wiring substrate 211 is straight (not bent) when the first wiring substrate 211 passes through the slit 202 unless there is no fold habit on the first wiring substrate 211.

Thus, the electrical part 504 is mounted on a side to be the inner face of the first wiring substrate 211 in a state in which the first wiring substrate 211 is bent. Thus, the electrical part 504 mounted on the first wiring substrate 211 is not easily caught by an end of the slit 202. Therefore, it becomes easier to pass the first wiring substrate 211 through the slit 202.

Figure 13:
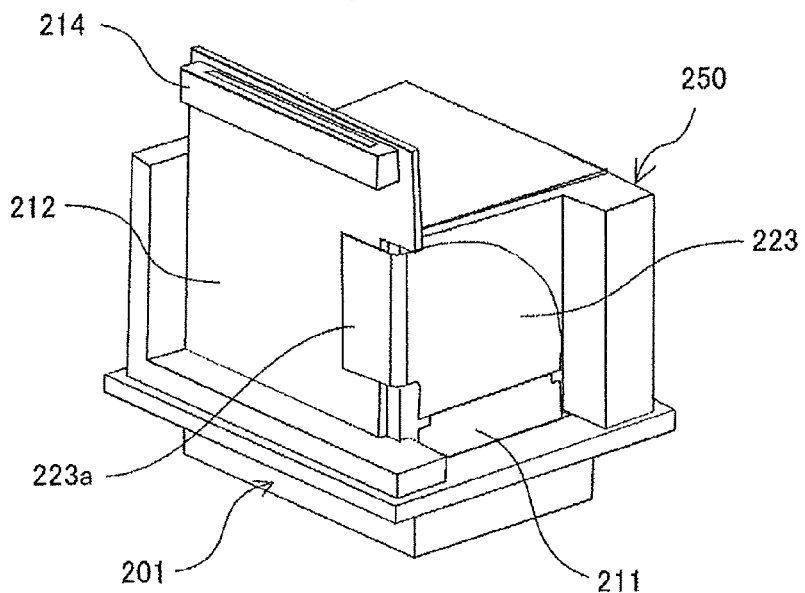
FIG. 13 is a perspective view of a liquid discharge head according to an eighth embodiment of the present disclosure.

FIG. 13 illustrates an eighth embodiment of the head 404 according to the present disclosure, showing a perspective view of the head 404 according to the eighth embodiment.

A holder 250 is mounted on the body 201 that discharges the liquid. The holder 250 holds the first wiring substrate 211, the second wiring substrate 212, and the third wiring substrate 223.

The holder 250 holds the first wiring substrate 211 on a side face of the holder 250 along the short side of the body 201. The holder 250 holds the second wiring substrate 212 on a side face of the holder 250 along the longitudinal direction of the body 201. The holder 250 holds the third wiring substrate 223 such that a principal surface of the third wiring substrate 223 overlaps with a surface of the first wiring substrate 211. A leading end 223a of the third wiring substrate 223 is connected to an outer surface of the second wiring substrate 212 while facing the outer surface of the second wiring substrate 212.

The first wiring substrate 211, the second wiring substrate 212, and the third wiring substrate 223 are mounted (held) on the holder 250 by securing with screws, pinching the first wiring substrate 211, the second wiring substrate 212, and the third wiring substrate 223 to the holder 250 with clips, or fixing the third wiring substrate 223 to the holder 250 with a double-sided tape or adhesive.

Figure 14:
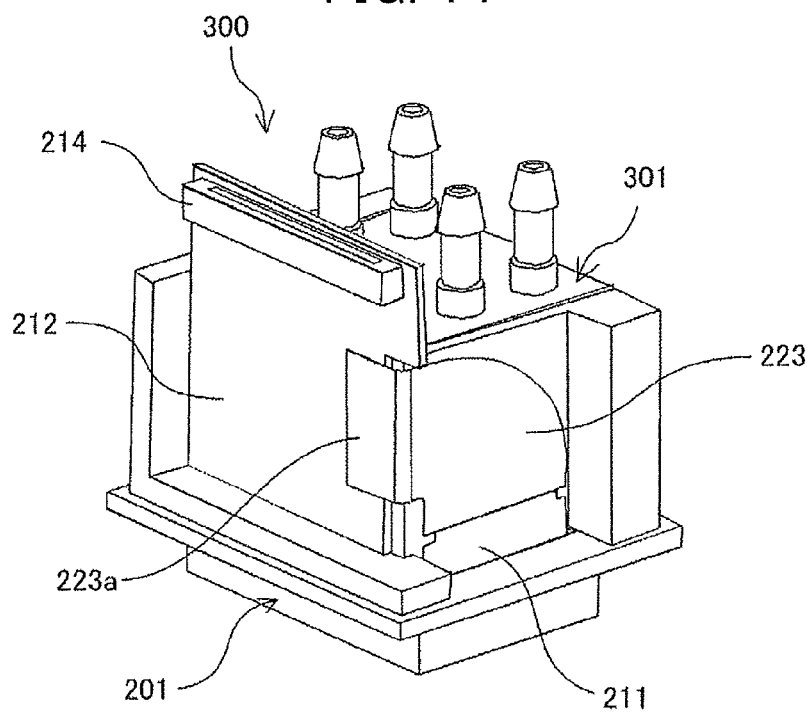
FIG. 14 is a perspective view of a liquid discharge head according to a ninth embodiment of the present disclosure.

FIG. 14 illustrates the head 404 according to a ninth embodiment of the present disclosure, showing a perspective view of the head 404 according to the ninth embodiment.

The head 300 includes a body 201 and a liquid supply member 301. The body 201 includes a nozzle face 1a on which a plurality of nozzles 4 to discharge liquid is formed. The liquid supply member 301 includes a liquid supply channel communicating with a common liquid chamber 10 interior the body 201 to supply liquid to the common liquid chamber 10.

A second wiring substrate 212 is a print board including a connector 214 to be connected to the outside. The second wiring substrate 212 is disposed along an outer surface of the liquid supply member 301. The outer surface of the liquid supply member 301 is arranged along a longitudinal direction of the body 201. Further, the second wiring substrate 212 stands substantially perpendicular (including perpendicular) to the nozzle face 1a of the body 201. This second wiring substrate 212 is connected to the first wiring substrate 211 via the third wiring substrate 223. The first wiring substrate 211 is extending from the body 201 from an end portion of the body 201 in a longitudinal direction of the body 201 such that a principal surface of the first wiring substrate 211 is disposed along the short side of the body 201.

FIGS. 15 to 18 illustrate an example of the body according to ninth embodiment of the present disclosure.

Figure 15:
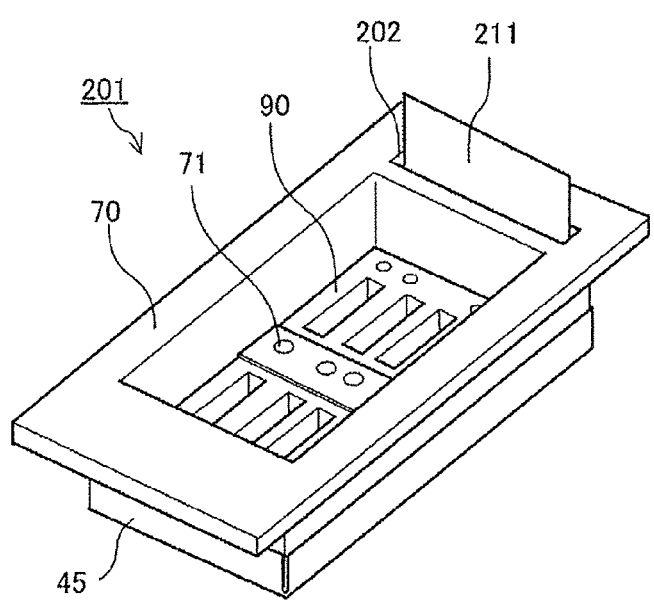
FIG. 15 is a perspective view of an example of a body according to a ninth embodiment of the present disclosure.
Figure 16:
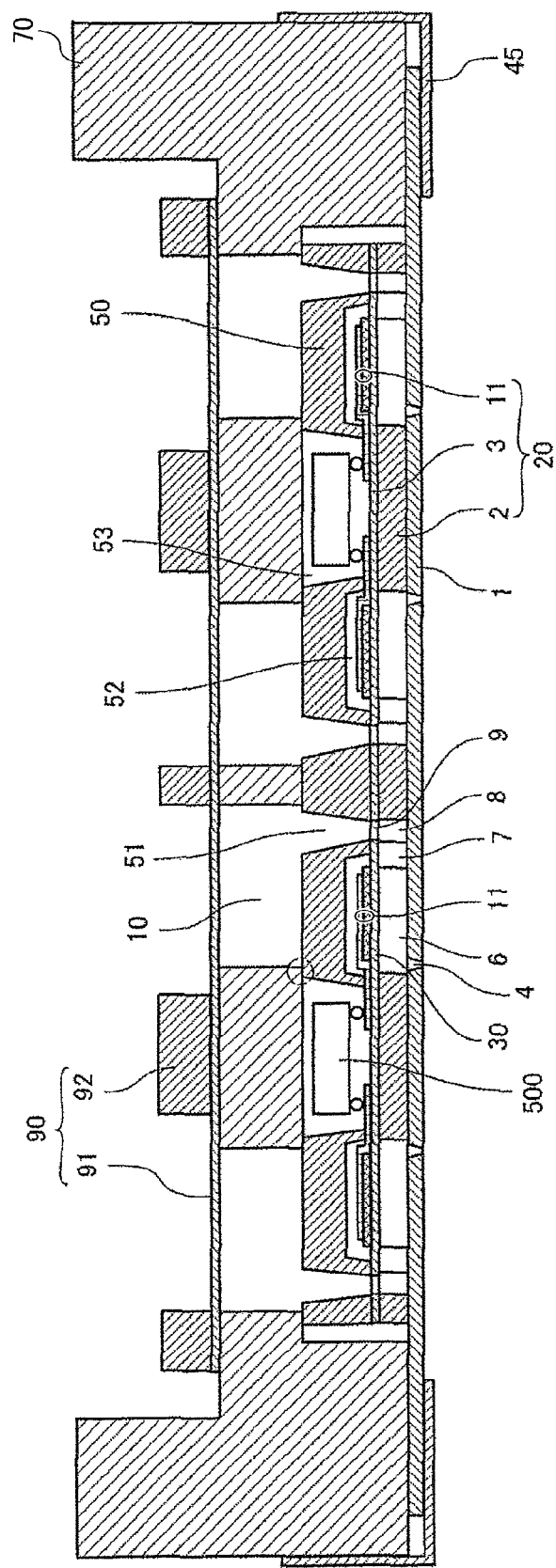
FIG. 16 is a cross-sectional view of the body along a direction perpendicular to a nozzle array of the body.
Figure 17:
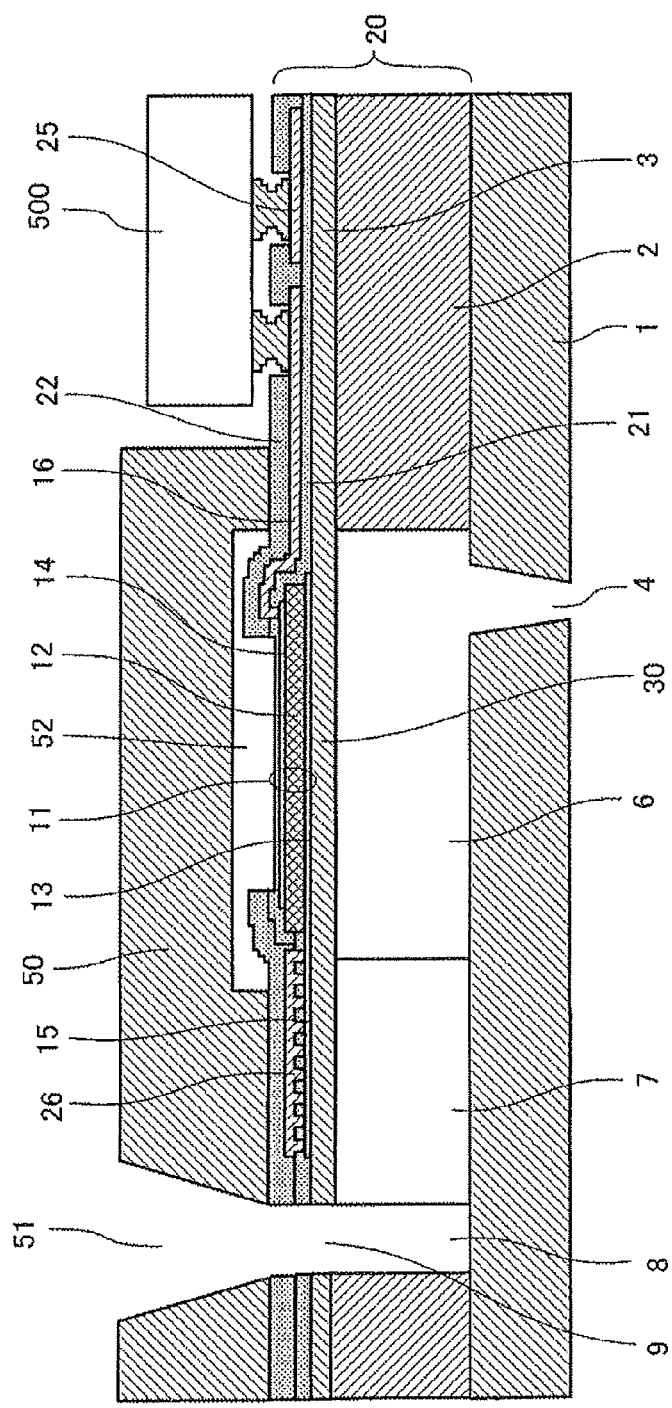
FIG. 17 is an enlarged cross-sectional view of a main portion of the body.
Figure 18:
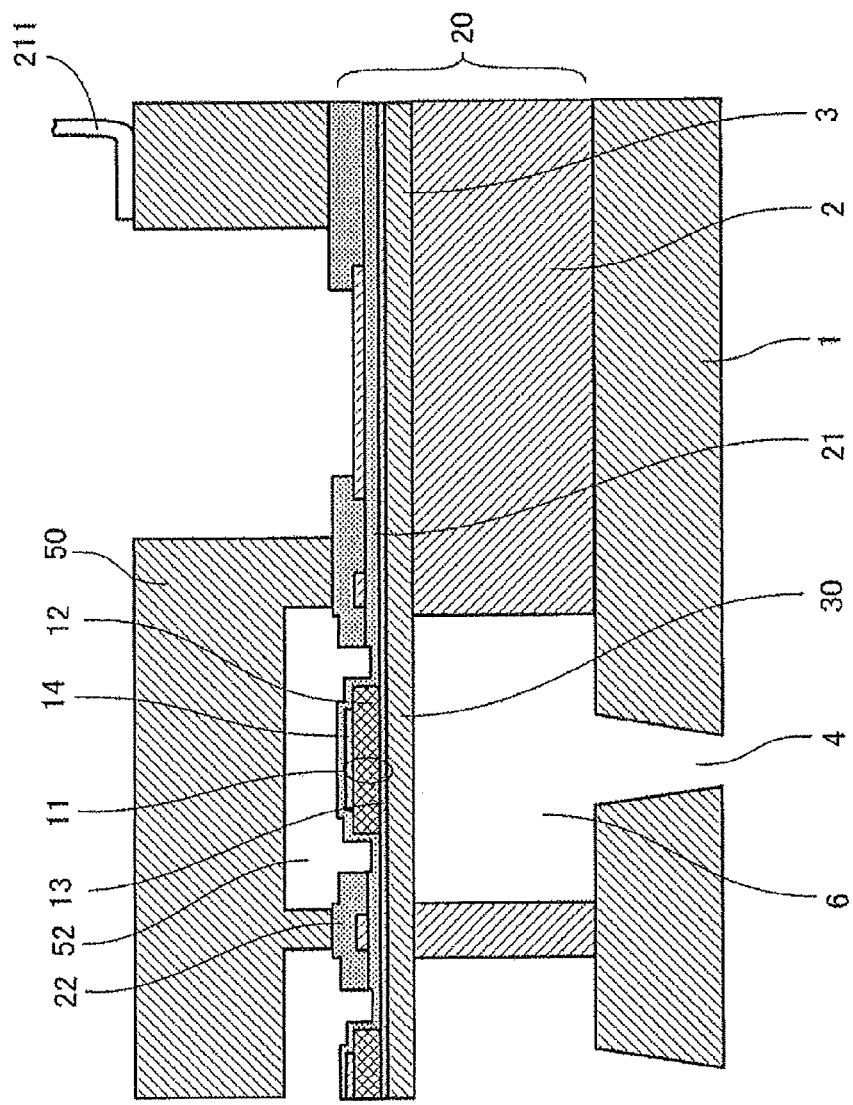
FIG. 18 is a cross-sectional view of a main portion of the body along the nozzle array.

FIG. 15 is a perspective view of the body 201. FIG. 16 is a cross-sectional view of the body 201 along the direction perpendicular to a nozzle array. FIG. 17 is an enlarged cross-sectional view of a main portion of the body of FIG. 16. FIG. 18 is a cross-sectional view of a portion of the body 201 along the nozzle array.

In FIG. 16, a plurality row of nozzles 4 is arrayed in the nozzle array. For example, there are four rows of nozzle array in FIG. 6. The nozzle array corresponds to the longitudinal direction Y in FIGS. 1 to 24 of the body 201.

The body 201 includes a nozzle plate 1, a channel plate 2, a diaphragm 3, piezoelectric elements 11, a holding substrate 50, a first wiring substrate 211, a common-chamber substrate 70, and a cover 45. The diaphragm 3 forms a wall surface of an individual liquid chamber 6. The piezoelectric elements 11 serves as a pressure generating elements (pressure generators). The first wiring substrate 211 is a wiring member includes a flexible printed circuit (FPC).

Here, an actuator substrate 20 includes a part constituted by the channel plate 2, the diaphragm 3, and the piezoelectric element 11.

Figure 27:
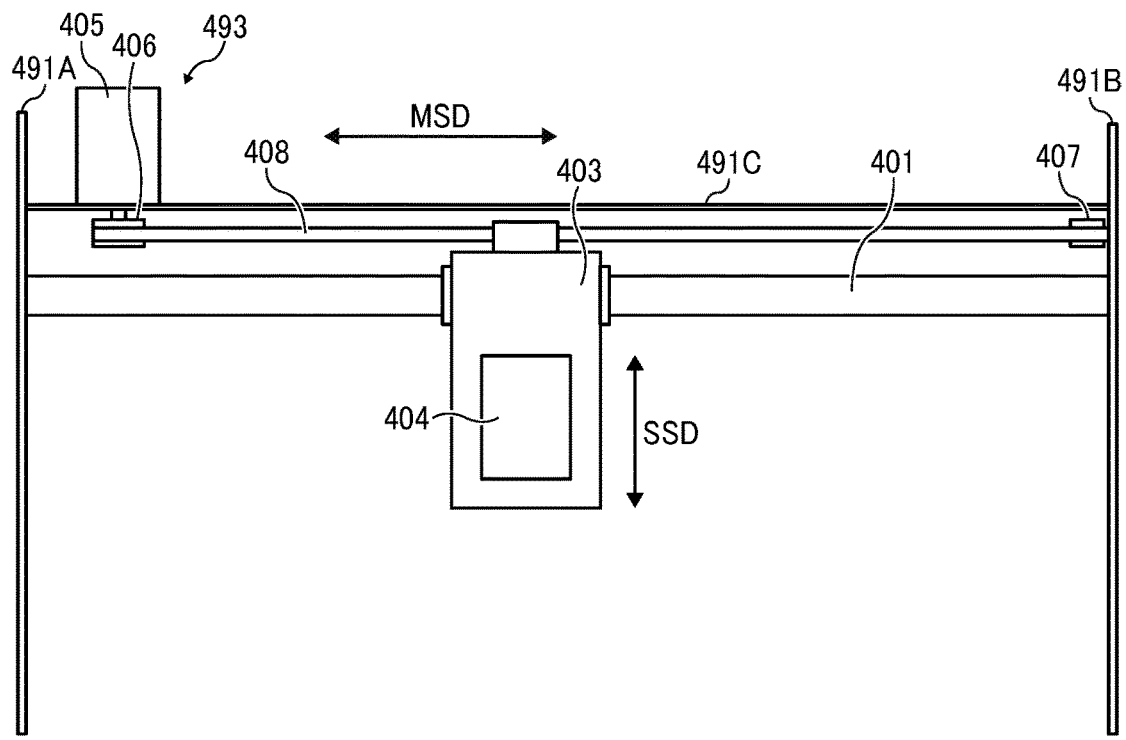
FIG. 27 is a plan view of an example of a portion of a liquid discharge device.

The nozzle plate 1 includes a plurality of nozzles 4 to discharge liquid. As illustrated in FIG. 27, the nozzles 4 are arrayed in four rows in a main scanning direction (MSD) to form four nozzle arrays.

With the nozzle plate 1 and the diaphragm 3, the channel plate 2 forms individual liquid chambers 6 communicating with the nozzles 4, fluid restrictors 7 communicating with the individual liquid chambers 6, and liquid introduction portions 8 communicating with the fluid restrictors 7.

The liquid introduction portions 8 are communicating with the common liquid chamber 10 formed by the common-chamber substrate 70 via openings 9 of the diaphragm 3 and an opening 51 served as a channel of the holding substrate 50.

The diaphragm 3 includes deformable vibration portions 30 forming one wall of the individual liquid chambers 6. The piezoelectric element 11 is disposed integrally with the vibration portion 30 on a face of the vibration portion 30 of the diaphragm 3 opposite the individual liquid chamber 6. The vibration portion 30 and the piezoelectric element 11 form a piezoelectric actuator.

As illustrated in FIG. 17, in the piezoelectric element 11, a lower electrode 13, a piezoelectric layer (piezoelectric body) 12, and an upper electrode 14 are laminated in this order from the vibration portion 30. An insulation film 21 is formed on the piezoelectric element 11.

The lower electrode 13 as a common electrode for the plurality of piezoelectric elements 11 is connected to a common-electrode power-supply wiring pattern 26 via a common wire 15. The lower electrode 13 is a single electrode layer formed across entire of the piezoelectric elements 11 in the nozzle array.

The upper electrodes 14 as individual electrodes for the piezoelectric elements 11 are connected to a driver integrated circuit (IC) 500 (hereinafter, driver IC 500) as a drive circuit via individual wires 16. The individual wire 16 is covered with an insulation film 22.

The driver IC 500 is mounted on the actuator substrate 20 by a flip-chip bonding method, for example, to cover an area between rows of the piezoelectric elements 11.

The driver IC 500 mounted on the actuator substrate 20 is connected to an individual-electrode power-supply wiring pattern 25 to which a drive waveform (drive signal) is supplied.

A wiring pattern provided at the first wiring substrate 211 is electrically connected to a wiring pattern of the driver IC 500. The opposite end of the first wiring substrate 211 is connected to the second wiring substrate 212 via the third wiring substrate 223 and is further connected to a controller mounted to an apparatus body.

The holding substrate 50 covering the piezoelectric element 11 on the actuator substrate 20 is bonded, with adhesive, to one side of the actuator substrate 20 on which the diaphragm 3 is disposed.

The holding substrate 50 includes openings 51, recesses 52, and openings 53. The openings 51 serves as a part of channel that communicates the common liquid chambers 10 with the individual liquid chambers 6. The recesses 52 accommodate the piezoelectric elements 11. The openings 53 accommodate the driver IC 500. The openings 51 are slit-shaped through holes extending along the nozzle array and form a part of the common liquid chamber 10.

The holding substrate 50 is interposed between the actuator substrate 20 and the common-chamber substrate 70 to form a part of a wall surface of the common liquid chamber 10.

The common-chamber substrate 70 forms the common liquid chamber 10 that supplies the liquid to each of the individual liquid chambers 6. Note that, in the present embodiment, the four common liquid chambers 10 are disposed corresponding to the four nozzle rows. Desired colors of liquids are supplied to the respective common liquid chambers 10 via the liquid supply port 71 communicating with the liquid supply member 301.

A damper unit 90 is bonded to the common-chamber substrate 70. The damper unit 90 includes a damper 91 and damper plates 92. The damper 91 is deformable and forms one wall of the common liquid chamber 10. The damper plates 92 reinforce the damper 91.

The common-chamber substrate 70 is bonded to the holding substrate 50 and an outer peripheral portion of the nozzle plate 1 with adhesive. The common-chamber substrate 70 accommodates the actuator substrate 20 and the holding substrate 50, thus forming a frame of this head 404.

The cover 45 is disposed to cover part of a peripheral are of the nozzle plate 1 and part of outer circumferential faces of the common-chamber substrate 70.

In the body 201, voltage is applied from the driver IC 500 to a portion between the upper electrode 14 and the lower electrode 13 of the piezoelectric element 11. Accordingly, the piezoelectric layer 12 expands in an electrode lamination direction (in other words, an electric-field direction) in which the upper electrode 14 and the lower electrode 13 are laminated, and contracts in a direction parallel to the vibration portion 30.

Thus, tensile stress arises at the lower electrode 13 side of the vibration portion 30 facing the lower electrode 13. This tensile stress causes the vibration portion 30 to bend toward an individual liquid chamber 6 side of the vibration portion 30 facing the individual liquid chamber 6. Accordingly, liquid within the individual liquid chamber 6 is pressurized and discharged from the nozzle 4.

FIGS. 19 to 21B illustrate the head 404 according to a tenth embodiment of the present disclosure.

Figure 19:
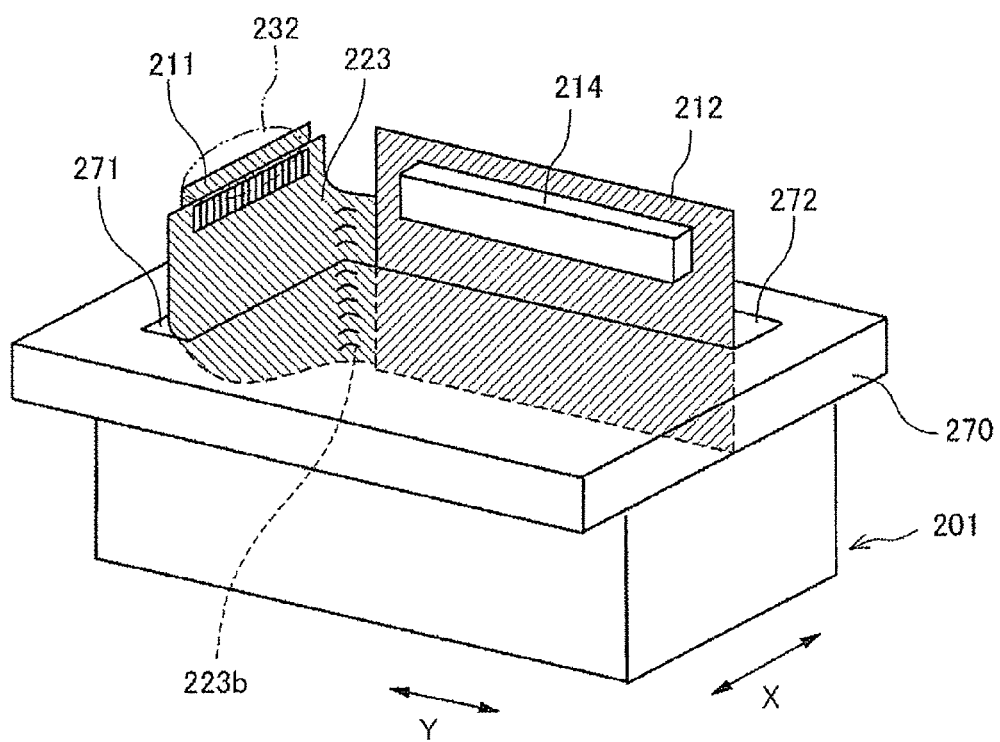
FIG. 19 is a perspective view of a liquid discharge head according to a tenth embodiment of the present disclosure.
Figure 20A:
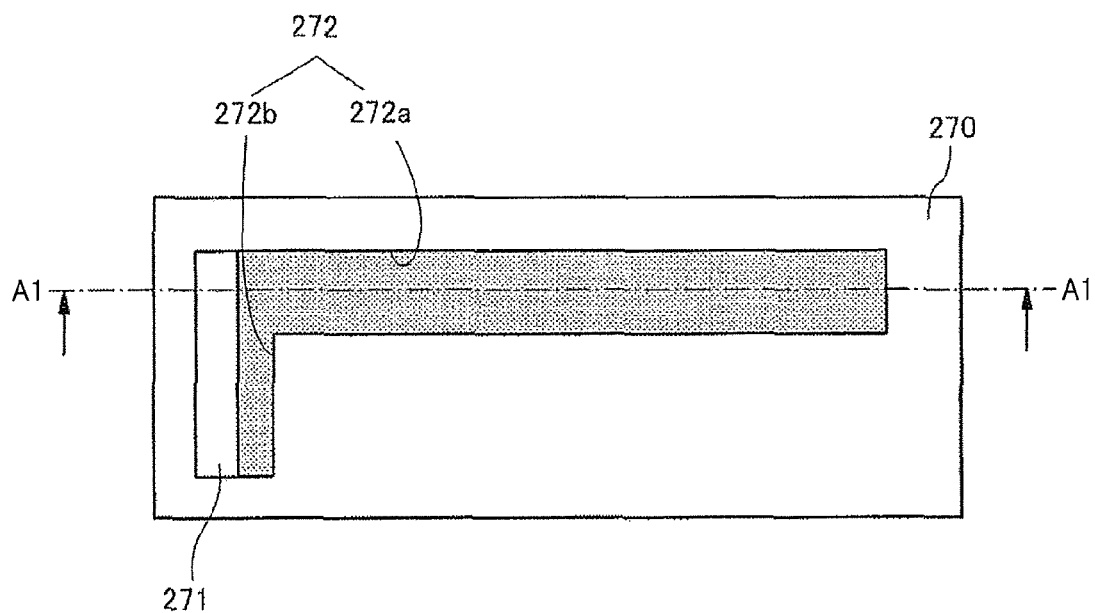
FIGS. 20A and 20B are a plan view and a cross-sectional view of a frame member in the tenth embodiment.
Figure 20B:
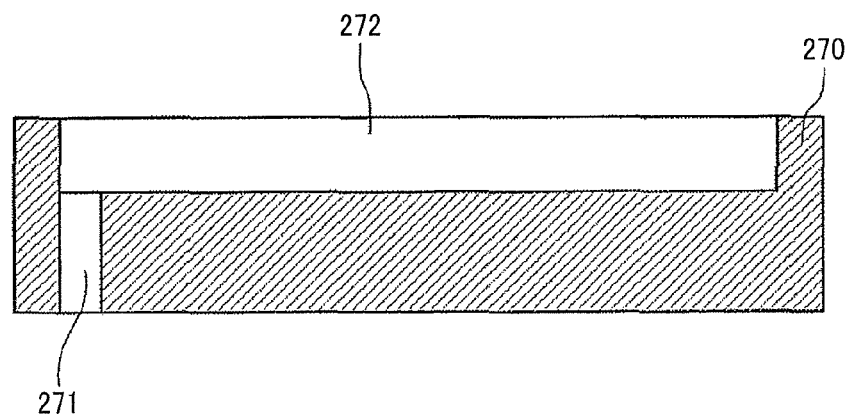
Figure 21A:
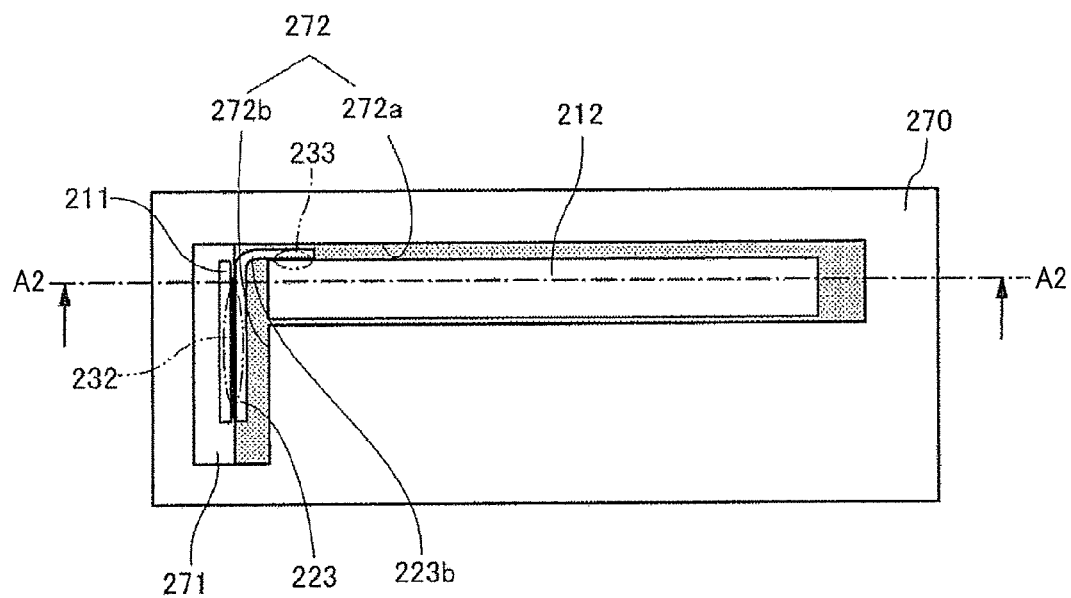
FIGS. 21A and 21B are a plan view and a cross-sectional view of the frame member where wiring substrates are disposed on the frame member.

FIG. 19 is a perspective view of the head 404. FIG. 20A is a plan view, and FIG. 20B is a cross-sectional view along the line A1-A1 in FIG. 20A of a frame member. FIG. 21A is a plan view, and FIG. 20B is a cross-sectional view along the line A2-A2 in FIG. 21A of the frame member on which the wiring substrate is disposed.

A frame member 270 of the body 201 includes a slit 271 penetrating through the frame member 270 to pull the first wiring substrate 211 outside the body 201. The slit 271 forms an opening corresponding to the slit 202 in the first embodiment as illustrated in FIG. 1.

Further, the frame member 270 includes a groove 272 connected to the slit 271. The groove 272 opens to a face opposite the nozzle face 1a. That is, the groove 272 opens at a side of the frame member 270 from which the first wiring substrate 211 is pulled out (extends). In FIGS. 20A and 21A, a region corresponding to the groove 272 is chamfered.

The groove 272 is formed of a longitudinal portion 272a and a short portion 272b. The longitudinal portion 272a extends in a longitudinal direction of the body 201, and the short portion 272b extends in a short side of the body 201. The groove 272 has L-shape in a plan view viewed from upper face side of the frame member 270 by connecting the longitudinal portion 272a and the short portion 272b.

The first wiring substrate 211 is pulled (extends) outside the body 201 through the slit 271.

As illustrated in FIG. 21A, a principal surface of the third wiring substrate 223 is bent from a direction along the short side (indicated by the arrow X) of the body 201 to a direction along the longitudinal direction (indicated by the arrow Y) of the body 201. The third wiring substrate 223 is disposed across the short portion 272b and the longitudinal portion 272a. Thus, the third wiring substrate 223 includes a bending portion 223b at which the principal surface of the third wiring substrate 223 is bent from a direction along the short side (indicated by the arrow X) of the body 201 to a direction along the longitudinal direction (indicated by the arrow Y) of the body 201. The bending portion 223b is disposed interior the groove 272.

A principle surface of the second wiring substrate 212 is disposed along a longitudinal direction of the body 201. Further, the second wiring substrate 212 stands perpendicular to the nozzle face 1a of the body 201.

One terminal group of the first wiring substrate 211 is disposed outside the body 201 and is electrically connected to one terminal group of the third wiring substrate 223 at outside the body 201 with a solder connection or an anisotropic conductive film (ACF), for example. A connecting portion between the first wiring substrate 211 and the third wiring substrate 223 is referred to as an electrical connecting portion 232.

Another terminal group of the third wiring substrate 223 and the terminal group of the second wiring substrate 212 is electrically connected with a solder connection, for example. A connecting portion between the third wiring substrate 223 and the second wiring substrate 212 is referred to as an electrical connecting portion 233. A part of the electrical connecting portion 233 is disposed interior the longitudinal portion 272a. Thus, each of the part of the second wiring substrate 212 and the third wiring substrate 223 is disposed interior the groove 272.

In this way, the tenth embodiment can lower a height of the second wiring substrate 212 including a height of the electrical connecting portion 233 of the second wiring substrate 212 and the third wiring substrate 223. Thus, a protruding amount of the second wiring substrate 212 from the frame member 270 can be reduced. Therefore, the tenth embodiment can reduce the whole size of the head 404 in a height direction.

Figure 21B:
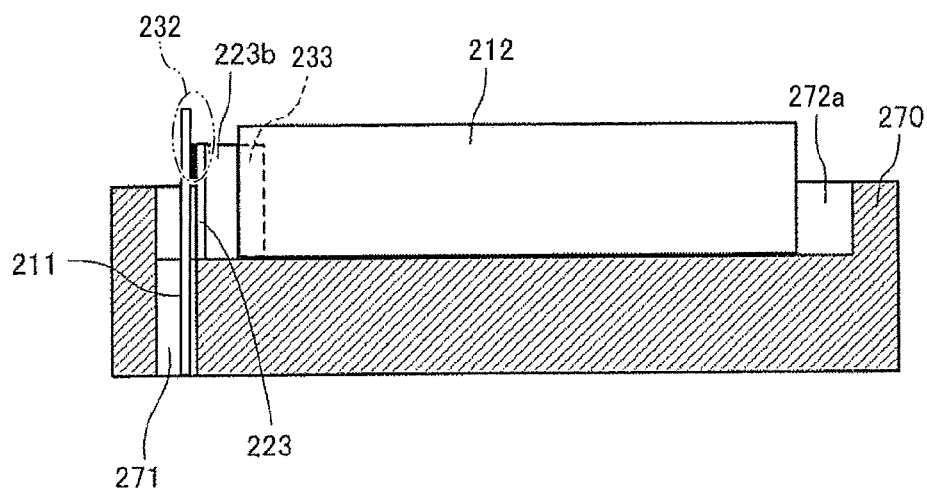

Further, the part of the third wiring substrate 223 is accommodated interior the short portion 272b. Thus, the wiring pattern of the third wiring substrate 223 overlaps with the first wiring substrate 211 in the height direction. As illustrated in FIGS. 19 and 21B, the wiring pattern of the third wiring substrate 223 is disposed lower than a leading end 211a of the first wiring substrate 211 in a height direction of the body 201.

Therefore, the tenth embodiment can reduce the whole size of the head 404 in a height direction in this respect.

The present embodiment has an effect such that the short portion 272b guides the third wiring substrate 223 when the third wiring substrate 223 is bent to be joined to the first wiring substrate 211 because the third wiring substrate 223 is disposed across the longitudinal portion 272a and the short portion 272b.

That is, it becomes easier to electrically connect (join) the third wiring substrate 223 to the first wiring substrate 211 by bending the third wiring substrate 223 along the short portion 272b while disposing the third wiring substrate 223 that is previously connected to the second wiring substrate 212 in the longitudinal portion 272a.

FIGS. 22A through 23B illustrate the head 404 according to an eleventh embodiment of the present disclosure.

Figure 22A:
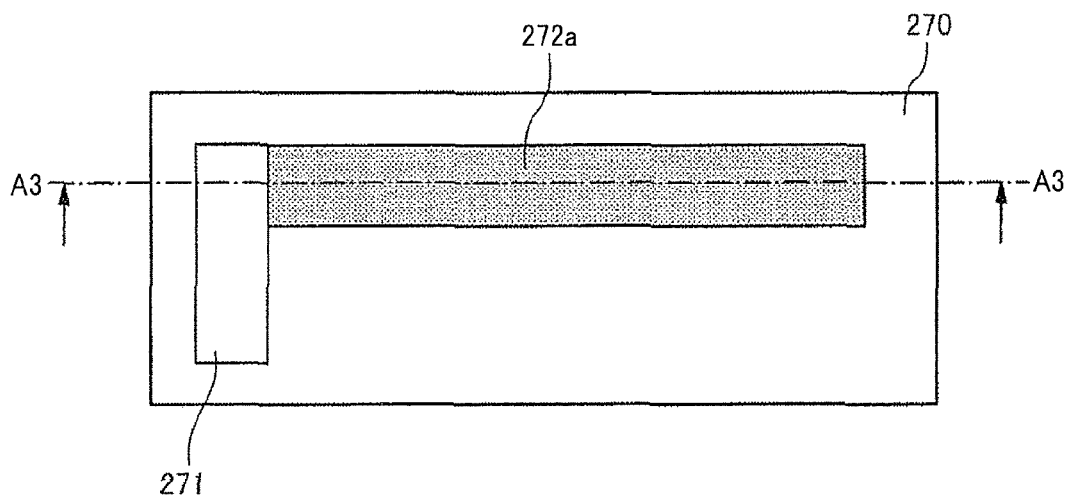
FIGS. 22A and 22B are a plan view and a cross-sectional view of a frame member according to an eleventh embodiment of the present disclosure.
Figure 22B:
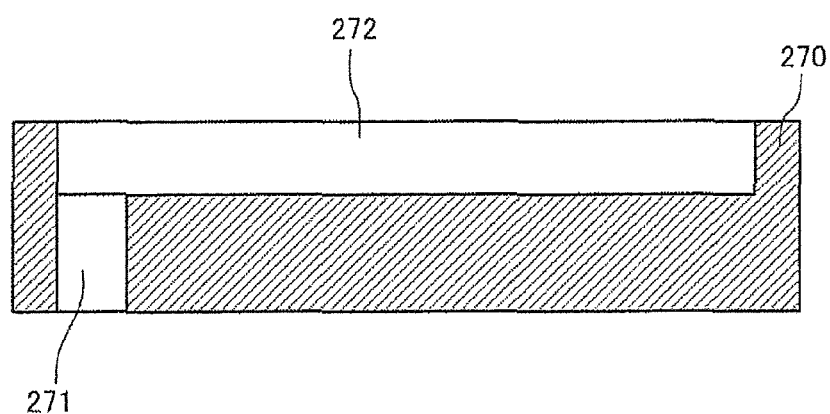
Figure 23A:
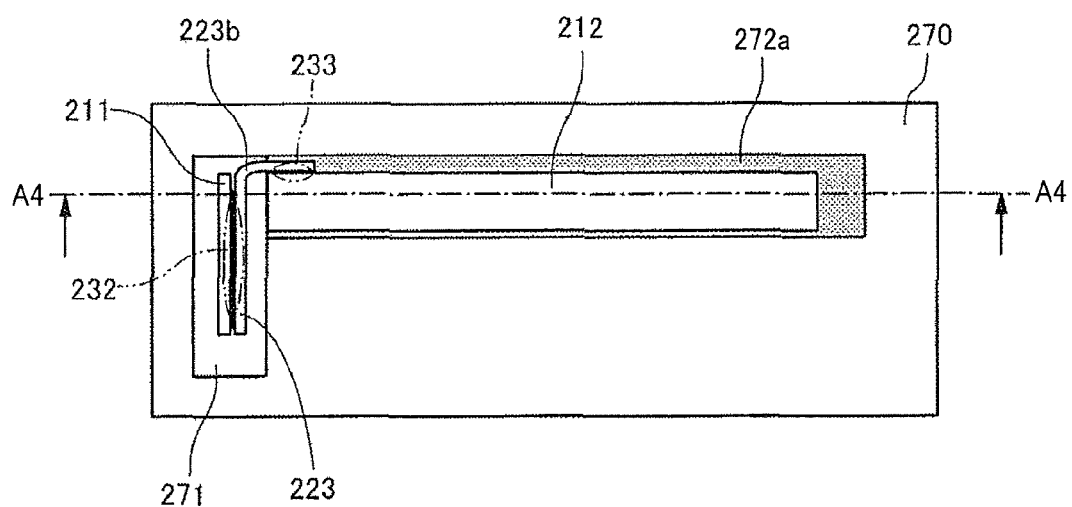
FIGS. 23A and 23B are a plan view and a cross-sectional view of the frame member where wiring substrates are disposed on the frame member.
Figure 23B:
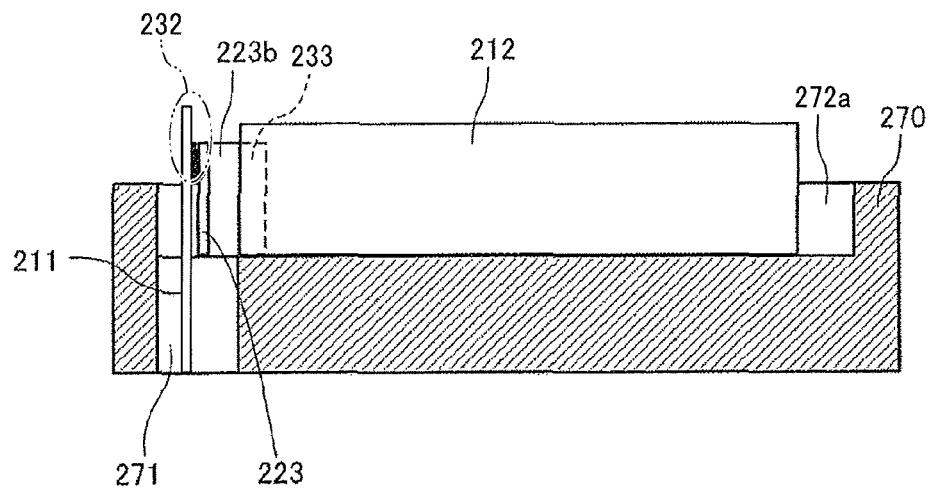

FIG. 22A is a plan view, and FIG. 22B is a cross-sectional view along the line A3-A3 in FIG. 22A of a frame member. FIG. 23A is a plan view, and FIG. 23B is a cross-sectional view along the line A4-A4 in FIG. 23A of the frame member on which the wiring substrate is disposed.

The eleventh embodiment includes a groove 272 that does not include the short portion 272b in the tenth embodiment, and includes only the longitudinal portion 272a in the tenth embodiment.

Here, the bending portion 223b of the third wiring substrate 223 to be electrically connect to the second wiring substrate 212 is disposed interior the groove 272 (longitudinal portion 272a). Another portion of the third wiring substrate 223 is disposed interior the slit 271 as illustrated in FIGS. 23A and 23B.

Even configuring the body 201 in this way, the eleventh embodiment can lower the height of the second wiring substrate 212 including the height of the electrical connecting portion 233 of the second wiring substrate 212 and the third wiring substrate 223. Thus, a protruding amount of the second wiring substrate 212 from the frame member 270 can be reduced. Therefore, the eleventh embodiment can reduce the whole size of the head 404 in a height direction. Further, even configuring the body 201 in this way, the wiring pattern of the third wiring substrate 223 is lower than the leading end 211a of the first wiring substrate 211 in the height direction. Therefore, the eleventh embodiment can reduce the whole size of the head 404 in a height direction in this respect.

Figure 24:
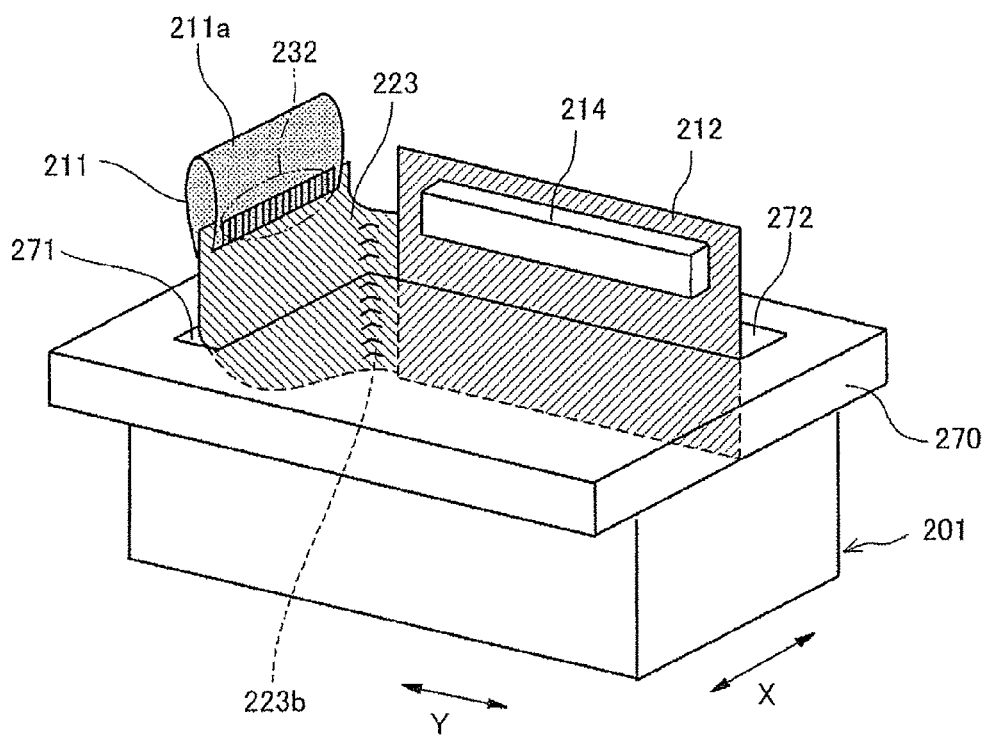
FIG. 24 is a perspective view of a liquid discharge head according to a twelfth embodiment of the present disclosure.

FIG. 24 illustrates the head 404 according to a twelfth embodiment of the present disclosure, showing a perspective view of the head 404.

In the present embodiment, the first wiring substrate 211 and the third wiring substrate 223 are joined in a state in which a leading end 211a of the first wiring substrate 211 extending from the slit 271 of the frame member 270 is folded (bent) back to the slit 271 side.

That is, in case a long wiring substrate is used as the first wiring substrate 211, a position of the terminal group on a leading end 211a of the first wiring substrate 211 and a position of the terminal group of the third wiring substrate 223 may not match in a height direction if the first wiring substrate 211 is just extending from the slit 271 of the frame member 270.

Thus, the position of the terminal group on the leading end 211a of the first wiring substrate 211 can be adjusted with the position of the terminal group of the third wiring substrate 223 by folding the leading end 211*a* of the first wiring substrate 211 extending from the slit 271 back toward the slit 271. Thereby, the terminal group of the first wiring substrate 211 and the terminal group of the third wiring substrate 223 can be joined and electrically connected after adjusting the height of each terminal group.

Figure 25:
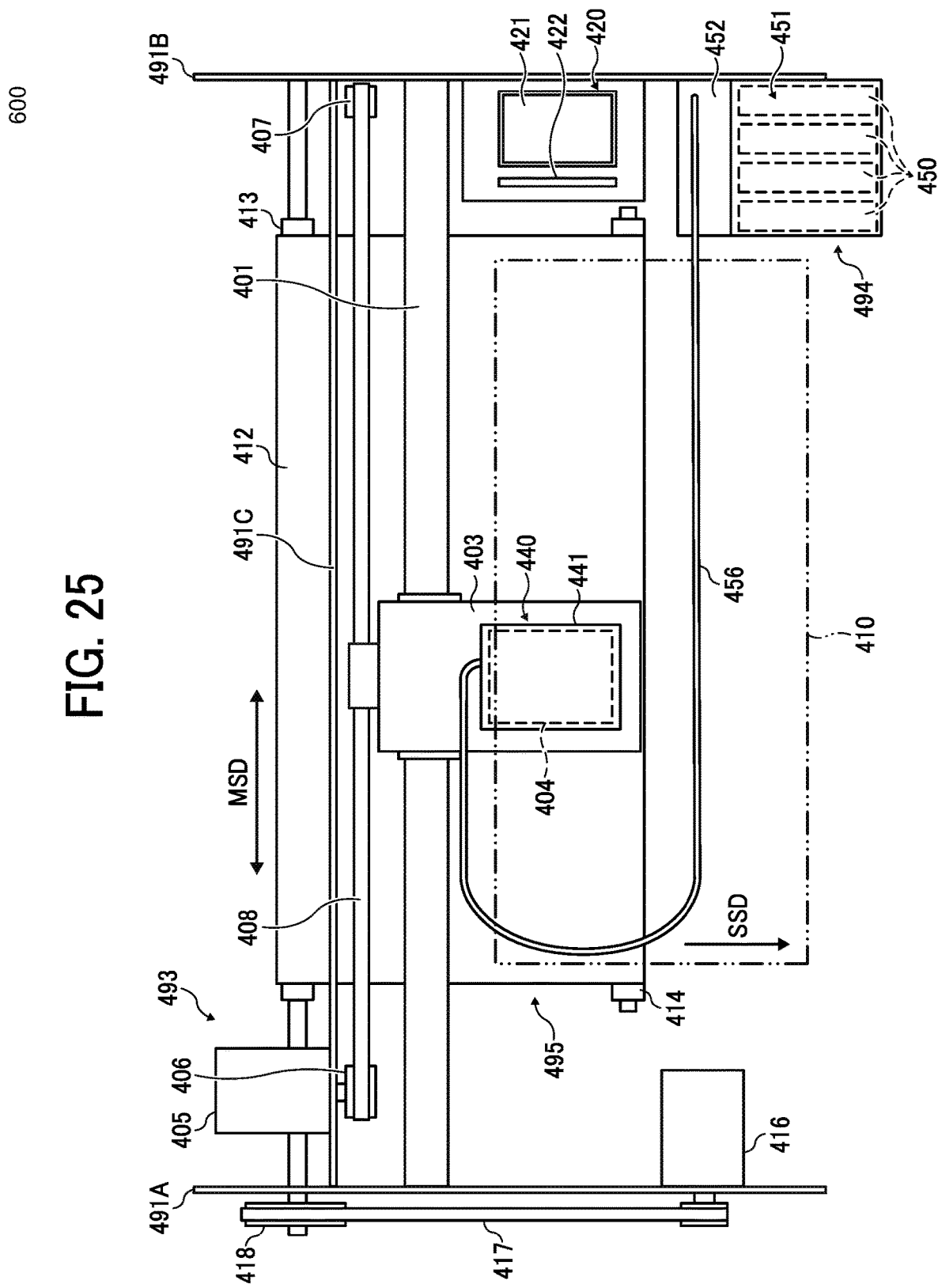
FIG. 25 is a plan view of a portion of a liquid discharge apparatus according to an embodiment of the present disclosure.
Figure 26:
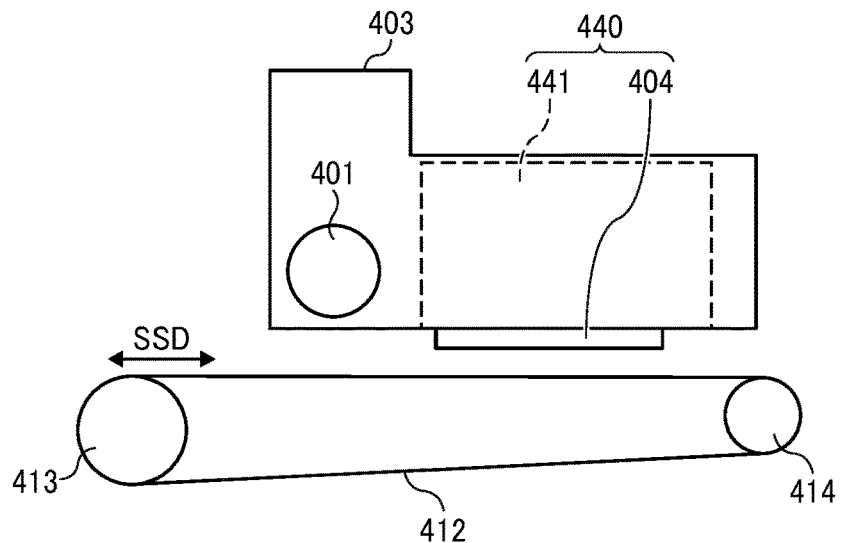
FIG. 26 is a side view of a portion of the liquid discharge apparatus.

FIGS. 25 and 26 illustrate an example of a liquid discharge apparatus 600 according to the present embodiment.

FIG. 25 is a plan view of a main part of the liquid discharge apparatus 600. FIG. 26 is a side view of a portion of the liquid discharge apparatus 600.

The liquid discharge apparatus 600 is a serial-type apparatus in which a drive unit 493 reciprocally moves a carriage 403 in a main scanning direction indicated by arrow MSD in FIG. 25. The drive unit 493 includes a guide 401, a main scanning motor 405, a timing belt 408, for example. The guide 401 is laterally bridged between a left side plate 491A and a right side plate 491B and supports the carriage 403 so that the carriage 403 is movable along the guide 401. The main scanning motor 405 reciprocally moves the carriage 403 in the main scanning direction MSD via the timing belt 408 laterally bridged between a drive pulley 406 and a driven pulley 407.

The carriage 403 mounts a liquid discharge device 440 in which the head 404 according to the present embodiment and a head tank 441 are integrated into a single unit. The head 404 of the liquid discharge device 440 discharges color liquids of, for example, yellow (Y), cyan (C), magenta (M), and black (K). The head 404 includes nozzle arrays, each including a plurality of nozzles four arrayed in row in a sub-scanning direction indicated by arrow SSD in FIGS. 25 and 26. The sub-scanning direction (SSD) is perpendicular to the main scanning direction MSD. The head 404 is mounted to the carriage 403 so that ink droplets are discharged downward.

The main scanning direction MSD illustrated in FIGS. 25 and 27 corresponds to the short side X in FIGS. 1 and 2 of the body 201, and the sub-scanning direction SSD illustrated in FIGS. 25 and 27 corresponds to the longitudinal direction Y in FIGS. 1 to 24 of the body 201.

The liquid stored outside the head 404 is supplied to the head 404 via a supply unit 494 that supplies the liquid from a liquid cartridge 450 to the head tank 441.

The supply unit 494 includes, e.g., a cartridge holder 451 as a mount to mount a liquid cartridge 450, a tube 456, and a liquid feed unit 452 including a liquid feed pump. The liquid cartridge 450 is detachably attached to the cartridge holder 451. The liquid is supplied to the head tank 441 by the liquid feed unit 452 via the tube 456 from the liquid cartridge 450.

The liquid discharge apparatus 600 includes a conveyance unit 495 to convey a sheet 410. The conveyance unit 495 includes a conveyance belt 412 as a conveyor and a sub-scanning motor 416 to drive the conveyance belt 412.

The conveyance belt 412 attracts the sheet 410 and conveys the sheet 410 at a position facing the head 404. The conveyance belt 412 is in the form of an endless belt. The conveyance belt 412 is stretched between a conveyance roller 413 and a tension roller 414. The sheet 410 is attracted to the conveyance belt 412 by electrostatic force or air suction.

The conveyance roller 413 is rotated by a sub-scanning motor 416 via a timing belt 417 and a timing pulley 418, so that the conveyance belt 412 circulates in a sub-scanning direction indicated by arrow SSD in FIGS. 25 and 26.

At one side in the main scanning direction MSD of the carriage 403, a maintenance unit 420 to recover the head 404 in good condition is disposed on a lateral side (right-hand side) of the conveyance belt 412 in FIG. 25.

The maintenance unit 420 includes, for example, a cap 421 to cap the nozzle face (i.e., a face on which the nozzles are formed) la of the head 404 and a wiper 422 to wipe the nozzle face 1*a*.

The drive unit 493, the supply unit 494, the maintenance unit 420, and the conveyance unit 495 are mounted to a housing 491 that includes the left side plate 491A, the right side plate 491B, and a rear side plate 491C.

In the liquid discharge apparatus 600 thus configured, a sheet 410 is conveyed on and attracted to the conveyance belt 412 and is conveyed in the sub-scanning direction SSD by the cyclic rotation of the conveyance belt 412.

The head 404 is driven in response to image signals while the carriage 403 moves in the main scanning direction MSD, to discharge liquid to the sheet 410 stopped, thus forming an image on the sheet 410.

As described above, the liquid discharge apparatus 600 includes the head 404 according to the present embodiment, thus allowing stable formation of high quality images.

FIG. 27 illustrates another example of the liquid discharge device 440 according to another embodiment of the present disclosure, showing a plan view of a main part of the liquid discharge device 440.

The liquid discharge device 440A includes the housing 491, the drive unit 493, the carriage 403, and the head 404 among components of the liquid discharge apparatus 600. The left side plate 491A, the right side plate 491B, and the rear side plate 491C constitutes the housing 491.

Note that, in the liquid discharge device 440A, at least one of the maintenance unit 420 and the supply unit 494 described above may be mounted on, for example, the right side plate 491B.

Figure 28:
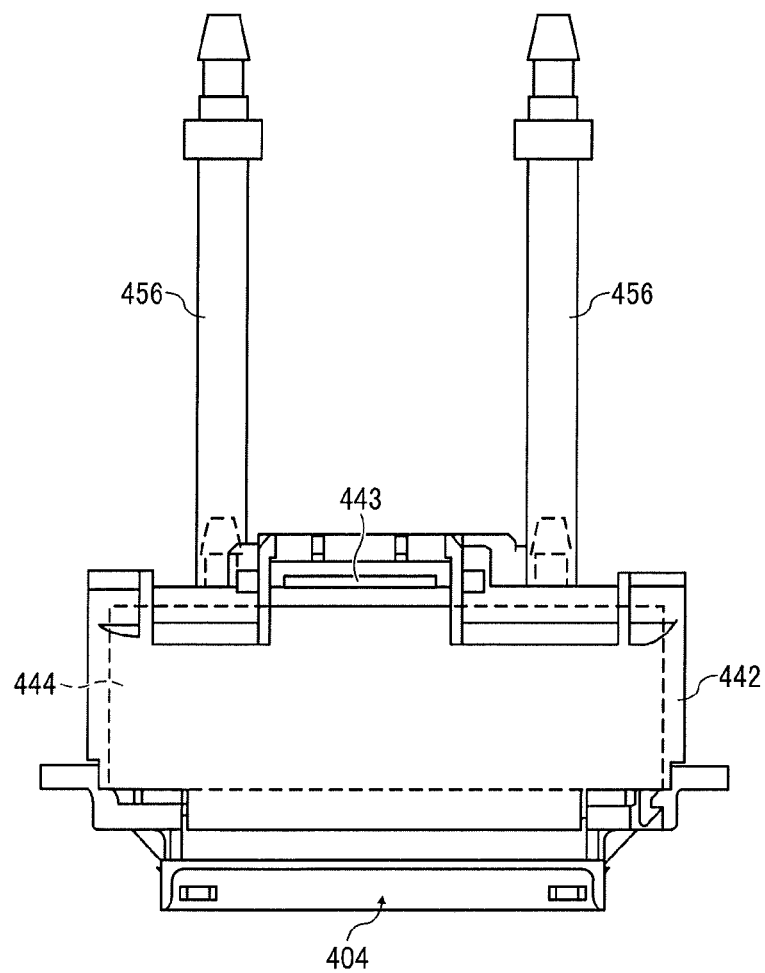
FIG. 28 is a front view of another example of the liquid discharge device.

FIG. 28 illustrates still another example of the liquid discharge device 440B according to an embodiment of the present disclosure, showing a front view of the liquid discharge device 440B.

The liquid discharge device 440B includes the head 404 to which a channel part 444 as a liquid supply member is mounted, and the tube 456 connected to the channel part 444.

Further, the channel part 444 is disposed interior a cover 442. Instead of the channel part 444, the liquid discharge device 440B may include the head tank 441. A connector 443 to electrically connect the head 404 to a power source is disposed above the channel part 444.

In the present disclosure, discharged liquid is not limited to a particular liquid as long as the liquid has a viscosity or surface tension to be discharged from a head. However, preferably, the viscosity of the liquid is not greater than 30 mPa·s under ordinary temperature and ordinary pressure or by heating or cooling.

Examples of the liquid include a solution, a suspension, or an emulsion including, for example, a solvent, such as water or an organic solvent, a colorant, such as dye or pigment, a functional material, such as a polymerizable compound, a resin, or a surfactant, a biocompatible material, such as DNA, amino acid, protein, or calcium, and an edible material, such as a natural colorant.

Such a solution, a suspension, or an emulsion can be used for, e.g., inkjet ink, surface treatment solution, a liquid for forming components of electronic element or light-emitting element or a resist pattern of electronic circuit, or a material solution for three-dimensional fabrication.

Examples of an energy source for generating energy to discharge liquid include a piezoelectric actuator (a laminated piezoelectric element or a thin-film piezoelectric element), a thermal actuator that employs a thermoelectric conversion element, such as a heating resistor (element), and an electrostatic actuator including a diaphragm and opposed electrodes.

"The liquid discharge device" is an integrated unit including the head and a functional part(s) or unit(s), and is an assembly of parts relating to liquid discharge. For example, "the liquid discharge device" may be a combination of the head with at least one of a head tank, a carriage, a supply unit, a maintenance unit, and a drive unit.

Herein, the terms "integrated" or "united" mean fixing the head and the functional parts (or mechanism) to each other by fastening, screwing, binding, or engaging and holding one of the head and the functional parts movably relative to the other. The head may be detachably attached to the functional part(s) or unit(s) each other.

For example, the head and a head tank may be integrated to form the liquid discharge device. The head and the head tank may be connected with each other via, e.g., a tube to integrally form the liquid discharge device. Here, a unit including a filter may further be added to a portion between the head tank and the head.

The liquid discharge device may be an integrated unit in which a head is integrated with a carriage to form a single integrated unit.

The liquid discharge device may be a head movably held by a guide that forms part of a drive unit, so that the head and the drive unit are integrated into a single unit. The liquid discharge device may include the head, the carriage, and the drive unit that are integrated into a single unit.

In another example, the cap that forms part of the maintenance unit may be secured to the carriage mounting the head so that the head, the carriage, and the maintenance unit are integrated into a single unit to form the liquid discharge device.

Further, the liquid discharge device may include tubes connected to the head mounted on the head tank or the channel member so that the head and the supply unit are integrated into a single unit. Liquid is supplied from a liquid reservoir source such as liquid cartridge to the head through the tube.

The drive unit may be a guide only. The supply unit may be a tube(s) only or a mount (loading unit) only.

The term "liquid discharge apparatus" used herein also represents an apparatus including the head or the liquid discharge device to discharge liquid by driving the head. The liquid discharge apparatus may be, for example, an apparatus capable of discharging liquid to a material to which liquid can adhere or an apparatus to discharge liquid toward gas or into liquid.

The "liquid discharge apparatus" may include devices to feed, convey, and eject the material on which liquid can adhere. The liquid discharge apparatus may further include a pretreatment apparatus to coat a treatment liquid onto the material, and a post-treatment apparatus to coat a treatment liquid onto the material, on which the liquid has been discharged.

The "liquid discharge apparatus" may be, for example, an image forming apparatus to form an image on a sheet by discharging ink, or a three-dimensional fabricating apparatus to discharge a fabrication liquid to a powder layer in which powder material is formed in layers, to form a three-dimensional fabrication object.

In addition, "the liquid discharge apparatus" is not limited to such an apparatus to form and visualize meaningful images, such as letters or figures, with discharged liquid. For example, the liquid discharge apparatus may be an apparatus to form meaningless images, such as meaningless patterns, or fabricate three-dimensional images.

The above-described term "material on which liquid can be adhered" represents a material on which liquid is at least temporarily adhered, a material on which liquid is adhered and fixed, or a material into which liquid is adhered to permeate.

Examples of the "medium on which liquid can be adhered" include recording media, such as paper sheet, recording paper, recording sheet of paper, film, and cloth, electronic component, such as electronic substrate and piezoelectric element, and media, such as powder layer, organ model, and testing cell. The "medium on which liquid can be adhered" includes any medium on which liquid is adhered, unless particularly limited.

Examples of "the material on which liquid can be adhered" include any materials on which liquid can be adhered even temporarily, such as paper, thread, fiber, fabric, leather, metal, plastic, glass, wood, and ceramic.

"The liquid discharge apparatus" may be an apparatus to relatively move a head and a medium on which liquid can be adhered. However, the liquid discharge apparatus is not limited to such an apparatus. For example, the liquid discharge apparatus may be a serial head apparatus that moves the head or a line head apparatus that does not move the head.

Examples of "the liquid discharge apparatus" further include a treatment liquid coating apparatus to discharge a treatment liquid to a sheet surface to coat the sheet surface with the treatment liquid to reform the sheet surface and an injection granulation apparatus to eject a composition liquid including a raw material dispersed in a solution from a nozzle to mold particles of the raw material.

The terms "image formation", "recording", "printing", "image printing", and "fabricating" used herein may be used synonymously with each other.

Numerous additional modifications and variations are possible in light of the above teachings. It is therefore to be understood that, within the scope of the above teachings, the present disclosure may be practiced otherwise than as specifically described herein. With some embodiments having thus been described, it is obvious that the same may be varied in many ways. Such variations are not to be regarded as a departure from the scope of the present disclosure and appended claims, and all such modifications are intended to be included within the scope of the present disclosure and appended claims.

What is claimed is:
1. A liquid discharge head comprising:
   a body including a nozzle face in which a plurality of nozzles is firmed to discharge liquid;
   a first wiring substrate extending from the body; and
   a second wiring substrate electrically connected to the first wiring substrate,
   wherein the second wiring substrate is disposed along a direction perpendicular to the nozzle face of the body,
   wherein a principal surface of the second wiring substrate is disposed along a longitudinal direction of the body,
   wherein a principal surface of the first wiring substrate is disposed along a direction intersecting and perpendicular to a direction along which the principal surface of the second wiring substrate is disposed, and
   wherein the first wiring substrate includes:

a terminal disposed on a first surface of a leading end of the first wiring substrate, the terminal being electrically connected to the second wiring substrate, and a reinforcing plate disposed on a second surface of the leading end of the first wiring substrate opposite the first surface of the leading end of the first wiring substrate on which the terminal is disposed.

2. The liquid discharge head according to claim 1, wherein a first distance from the first surface of the leading end of the first wiring substrate on which the terminal is disposed to a first end of an outer circumference of the body in a direction along a short side of the body is shorter than a second distance from the second surface of the leading end of the first wiring substrate on which the reinforcing plate is provided to a second end of the outer circumference of the body in the direction along the short side of the body.

3. The liquid discharge head according to claim 1, wherein the first wiring substrate is a flexible wiring board, and the second wiring substrate is a printed circuit board.

4. The liquid discharge head according to claim 1, wherein the first wiring substrate includes:
   a base,
   a wiring pattern on the base, and
   a protection layer to cover the wiring pattern, and
wherein a thickness of the reinforcing plate is greater than a thickness of the protection layer.

5. The liquid discharge head according to claim 1, wherein a reinforcing film is used for the reinforcing plate.

6. The liquid discharge head according to claim 1, wherein the body comprises a frame member, the frame member including a groove having an opening on a surface of the frame member opposite the nozzle face, the groove extending in a longitudinal direction of the body, and the groove accommodates at least a part of the second wiring substrate.

7. A liquid discharge device comprising the liquid discharge head according to claim 1.

8. The liquid discharge device according to claim 7, further comprising at least one of:
   a head tank to store the liquid to be supplied to the liquid discharge head,
   a carriage to mount the liquid discharge head,
   a supply unit to supply the liquid to the liquid discharge head,
   a maintenance unit to maintain the liquid discharge head, and
   a drive unit to move a carriage for mounting the liquid discharge head in a main scanning direction, to be integrated with the liquid discharge head as a single unit.

9. A liquid discharge apparatus comprising:
   the liquid discharge device according to claim 7; and
   a conveyor to convey a medium to the liquid discharge head,
   wherein the liquid discharge device discharges the liquid to the medium from the plurality of nozzles of the liquid discharge head.

10. The liquid discharge head according to claim 1, wherein the principal surface of the first wiring substrate is disposed along a short side of the body.

11. A liquid discharge head comprising:
    a body including a nozzle face in which a plurality of nozzles is firmed to discharge liquid;
    a first wiring substrate extending from the body; and
    a second wiring substrate electrically connected to the first wiring substrate,
    wherein the second wiring substrate is disposed along a direction perpendicular to the nozzle face of the body,
    wherein a principal surface of the second wiring substrate is disposed along a longitudinal direction of the body,
    wherein the first wiring substrate includes:
       a terminal disposed on a first surface of a leading end of the first wiring substrate, the terminal being electrically connected to the second wiring substrate, and
       a reinforcing plate disposed on a second surface of the leading end of the first wiring substrate opposite the first surface of the leading end of the first wiring substrate on which the terminal is disposed, and
    wherein a first distance from the first surface of the leading end of the first wiring substrate on which the terminal is disposed to a first end of an outer circumference of the body in a direction along a short side of the body is shorter than a second distance from the second surface of the leading end of the first wiring substrate on which the reinforcing plate is provided to a second end of the outer circumference of the body in the direction along the short side of the body.

12. The liquid discharge head according to claim 11, wherein the first wiring substrate is a flexible wiring board, and the second wiring substrate is a printed circuit board.

13. The liquid discharge head according to claim 11, wherein the first wiring substrate includes:
    a base,
    a wiring pattern on the base, and
    a protection layer to cover the wiring pattern, and
wherein a thickness of the reinforcing plate is greater than a thickness of the protection layer.

14. The liquid discharge head according to claim 11, wherein a reinforcing film is used for the reinforcing plate.

15. The liquid discharge head according to claim 11, wherein the body comprises a frame member, the frame member including a groove having an opening on a surface of the frame member opposite the nozzle face, the groove extending in a longitudinal direction of the body, and the groove accommodates at least a part of the second wiring substrate.

16. A liquid discharge device comprising the liquid discharge head according to claim 11.

17. The liquid discharge device according to claim 16, further comprising at least one of:
    a head tank to store the liquid to be supplied to the liquid discharge head,
    a carriage to mount the liquid discharge head,
    a supply unit to supply the liquid to the liquid discharge head,
    a maintenance unit to maintain the liquid discharge head, and
    a drive unit to move a carriage for mounting the liquid discharge head in a main scanning direction, to be integrated with the liquid discharge head as a single unit.

18. A liquid discharge apparatus comprising:
    the liquid discharge device according to claim 16; and
    a conveyor to convey a medium to the liquid discharge head,
    wherein the liquid discharge device discharges the liquid to the medium from the plurality of nozzles of the liquid discharge head.

* * * * *